(12) United States Patent
Hiramatsu

(10) Patent No.: US 10,672,856 B2
(45) Date of Patent: Jun. 2, 2020

(54) DISPLAY DEVICE AND METHOD OF MANUFACTURING DISPLAY DEVICE

(71) Applicant: Japan Display Inc., Tokyo (JP)

(72) Inventor: Masato Hiramatsu, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/226,764

(22) Filed: Dec. 20, 2018

(65) Prior Publication Data
US 2019/0206975 A1 Jul. 4, 2019

(30) Foreign Application Priority Data
Dec. 28, 2017 (JP) .................................. 2017-254509

(51) Int. Cl.
| | | |
|---|---|---|
| H01L 27/32 | (2006.01) | |
| H01L 51/00 | (2006.01) | |
| H01L 51/56 | (2006.01) | |
| H01L 29/66 | (2006.01) | |

(Continued)

(52) U.S. Cl.
CPC ...... *H01L 27/3276* (2013.01); *H01L 27/3258* (2013.01); *H01L 27/3262* (2013.01); *H01L 51/0097* (2013.01); *H01L 51/56* (2013.01); *H01L 27/1222* (2013.01); *H01L 27/1244* (2013.01); *H01L 27/1255* (2013.01); *H01L 27/1274* (2013.01); *H01L 27/1288* (2013.01); *H01L 29/66757* (2013.01); *H01L 29/78675* (2013.01); *H01L 2227/323* (2013.01); *H01L 2251/5338* (2013.01); *H01L 2251/5392* (2013.01)

(58) Field of Classification Search
CPC . H01L 27/3276; H01L 27/3258; H01L 51/56; H01L 51/0097; H01L 27/3262; H01L 27/1288; H01L 27/1274; H01L 29/78675; H01L 27/1255; H01L 27/1244; H01L 27/1222; H01L 2227/323; H01L 2251/5392; H01L 2251/5338; H01L 29/66757
See application file for complete search history.

(56) References Cited

U.S. PATENT DOCUMENTS

2014/0232975 A1* 8/2014 Ohira .................. G02F 1/13394
349/138

FOREIGN PATENT DOCUMENTS

JP 2016-126041 A 7/2016

* cited by examiner

*Primary Examiner* — Laura M Menz
*Assistant Examiner* — Candice Chan
(74) *Attorney, Agent, or Firm* — Michael Best & Friedrich LLP

(57) ABSTRACT

A display device including a substrate, a display region, a periphery region outside of the display region, a terminal part arranged with a plurality of terminal electrodes in the periphery region, a wiring arranged between the display region and the terminal part, a plurality of inorganic insulation layers, and an organic insulation film arranged between the display region and the terminal part. At least one of the plurality of inorganic insulation layer extends between the display region and the terminal part and includes an opening part between the display region and the terminal part, the organic insulation film is arranged overlapping the opening part, the organic insulation film has a larger film thickness at a center part than an end part of the opening part, and the wiring is arranged along an upper surface of the organic insulation film.

7 Claims, 19 Drawing Sheets

(51) Int. Cl.
*H01L 27/12* (2006.01)
*H01L 29/786* (2006.01)

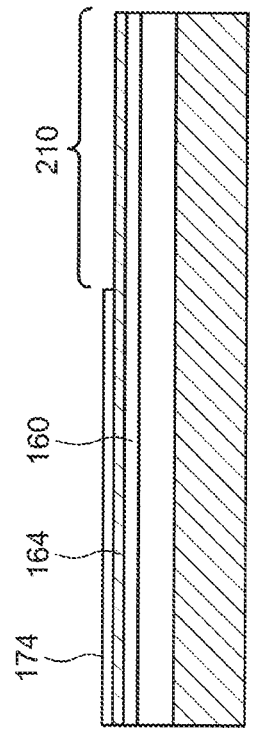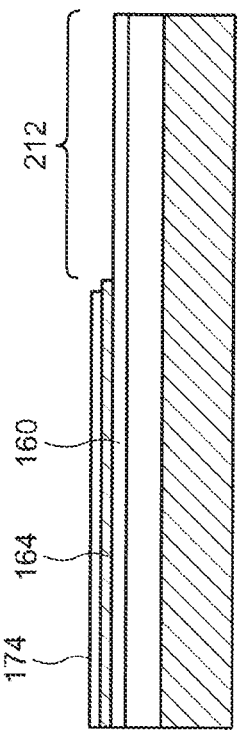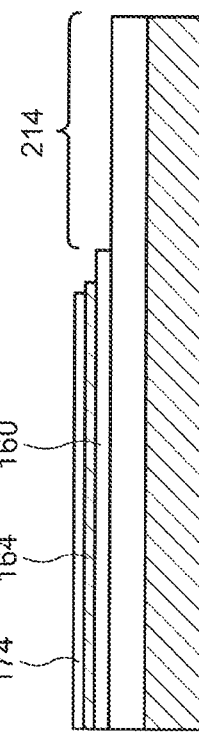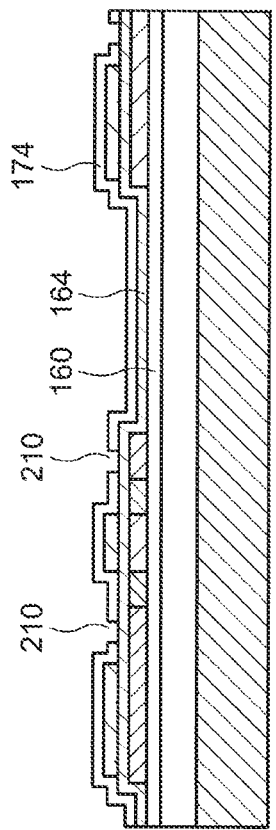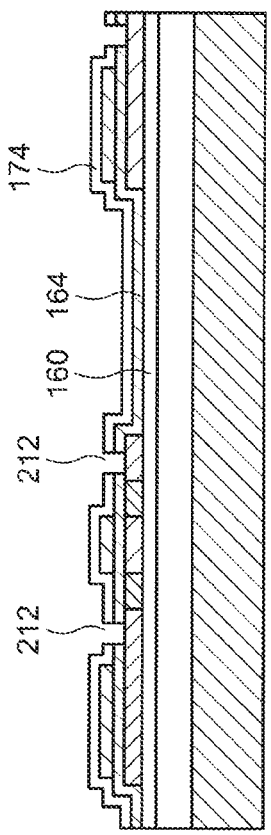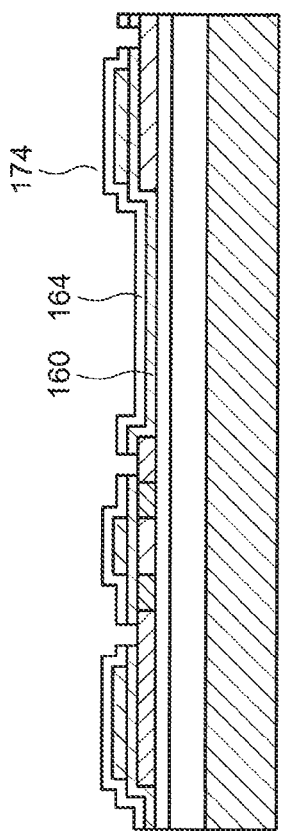
FIG. 10A  FIG. 10B  FIG. 10C

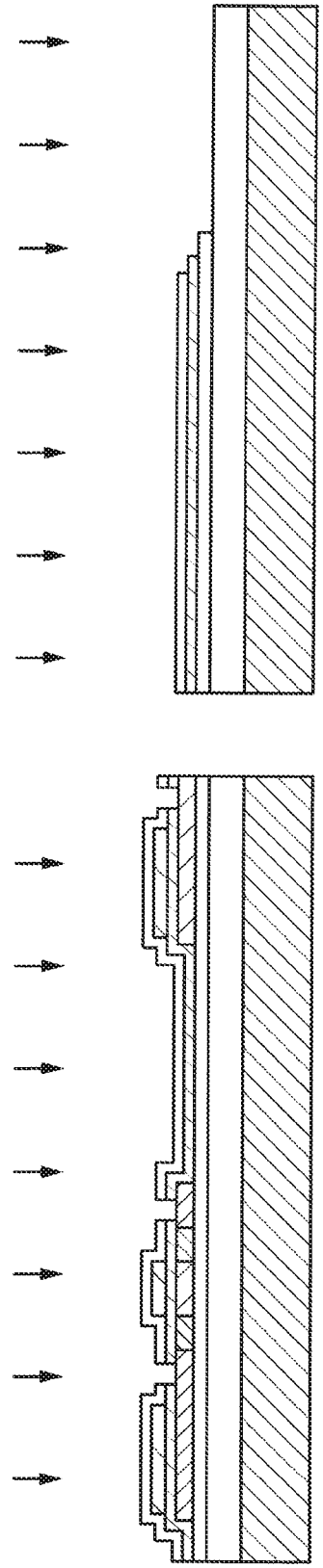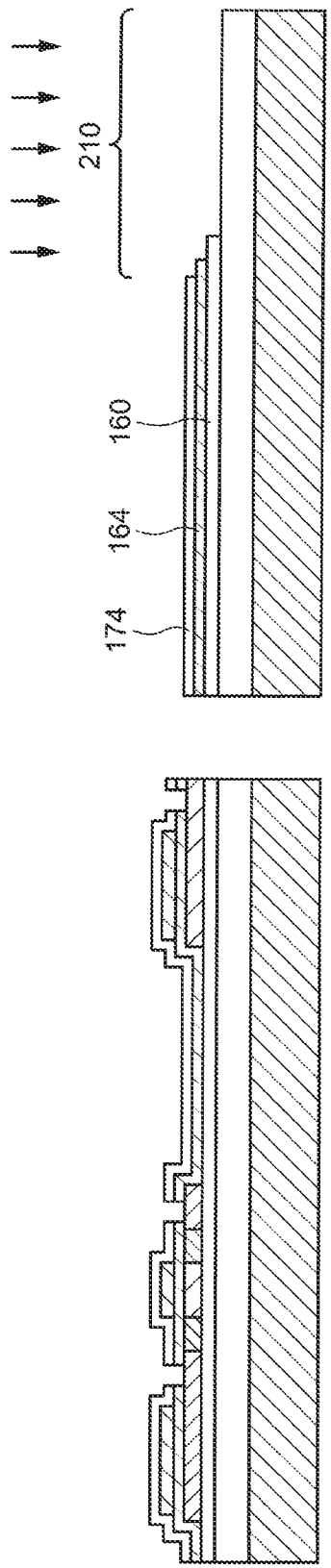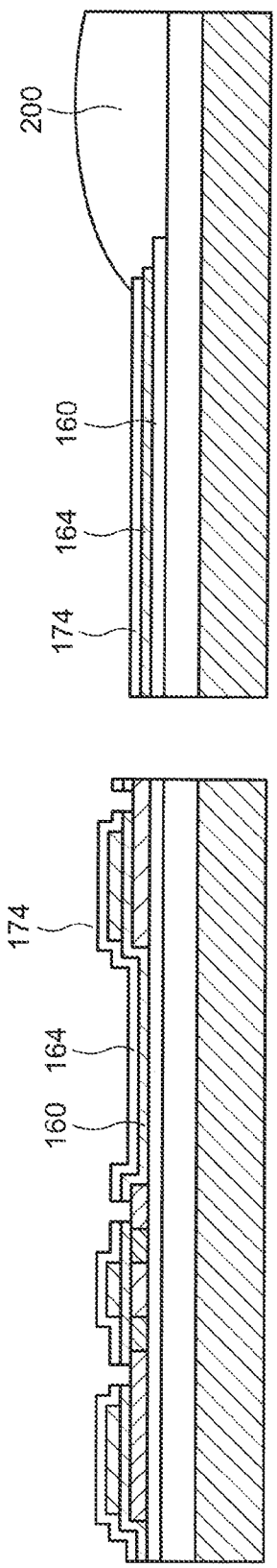

FIG. 12A
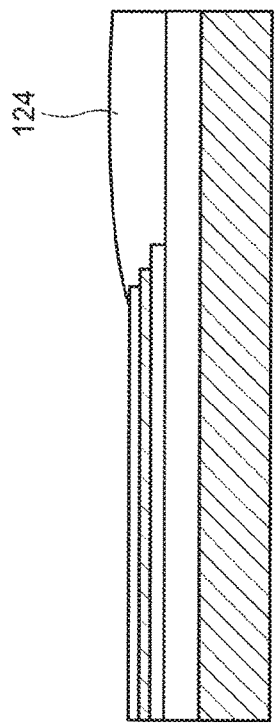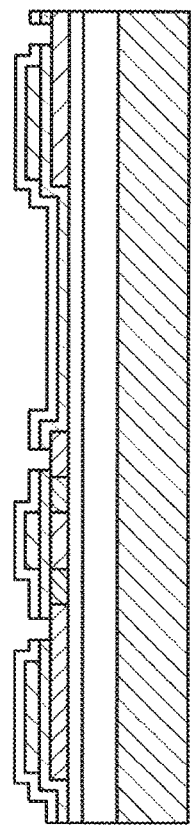
FIG. 12B
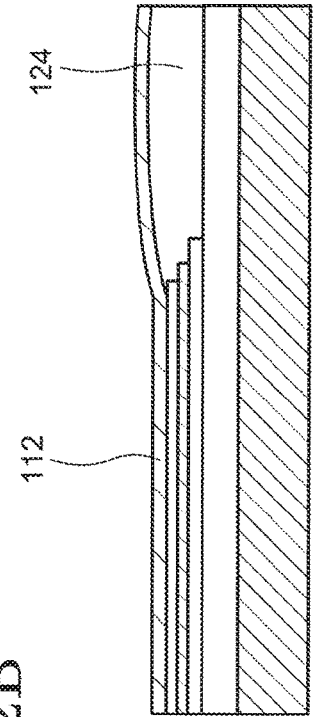
FIG. 12C
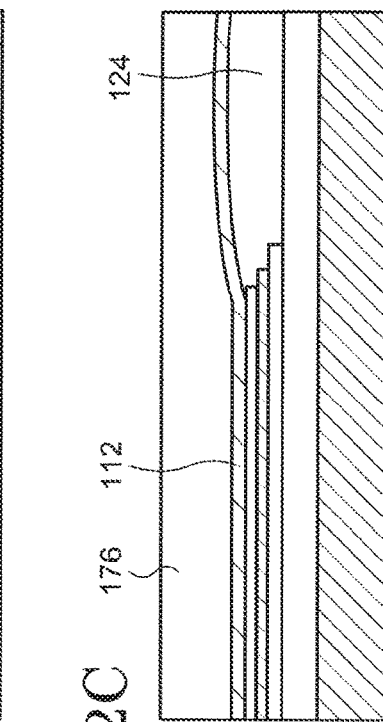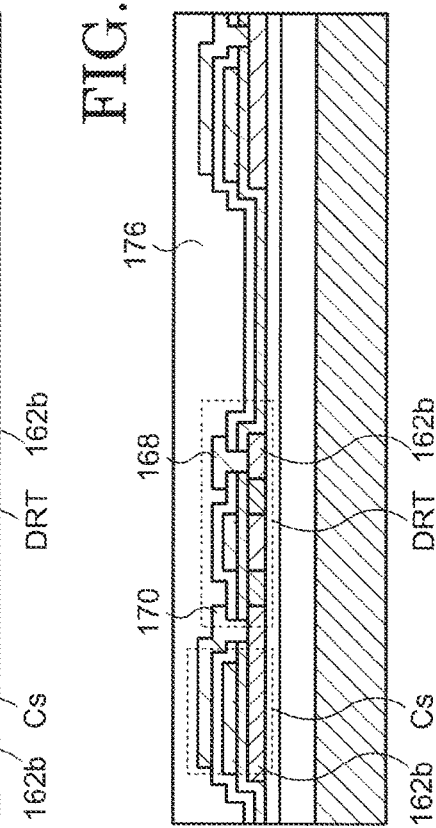

FIG. 14A
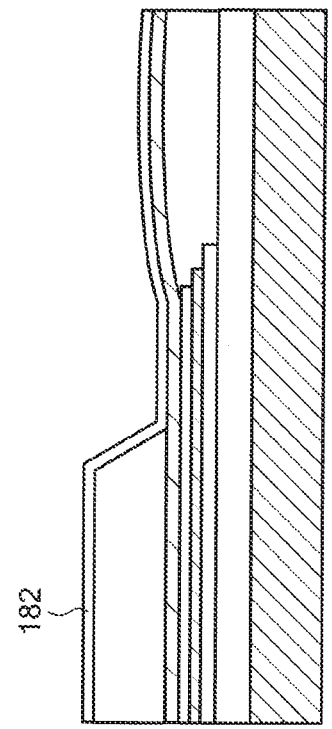
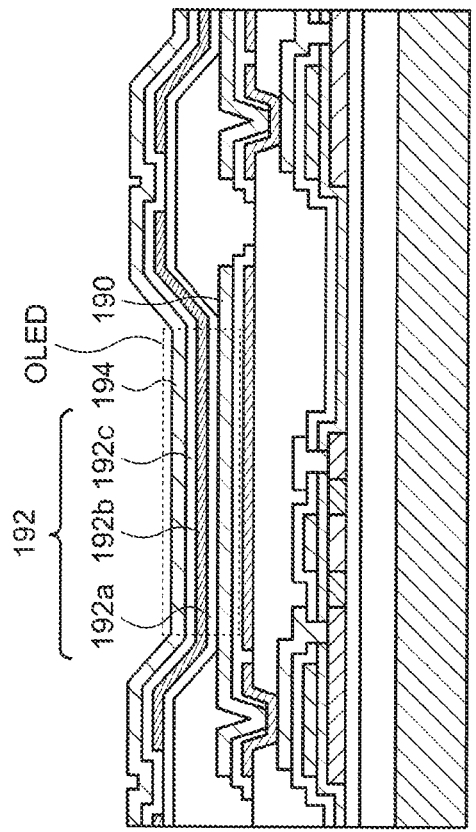
FIG. 14B
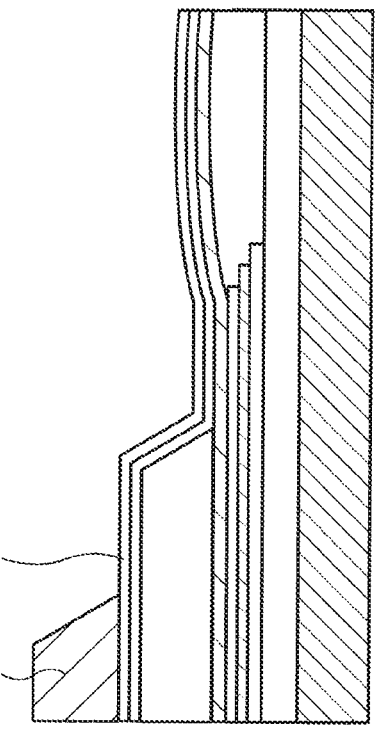
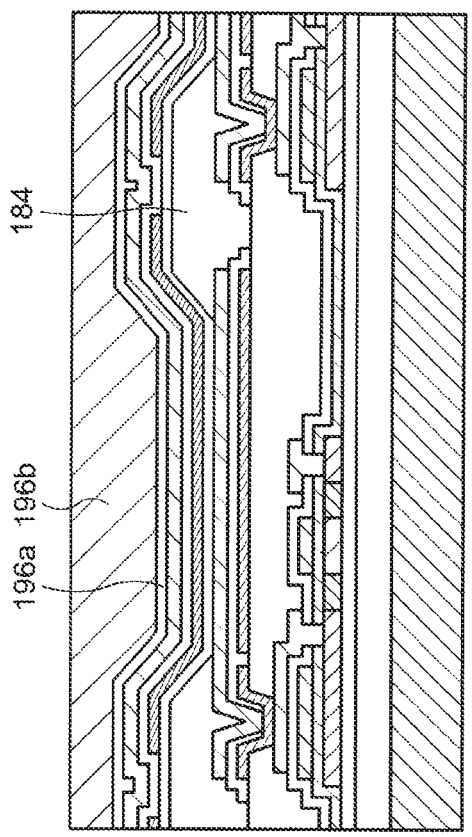

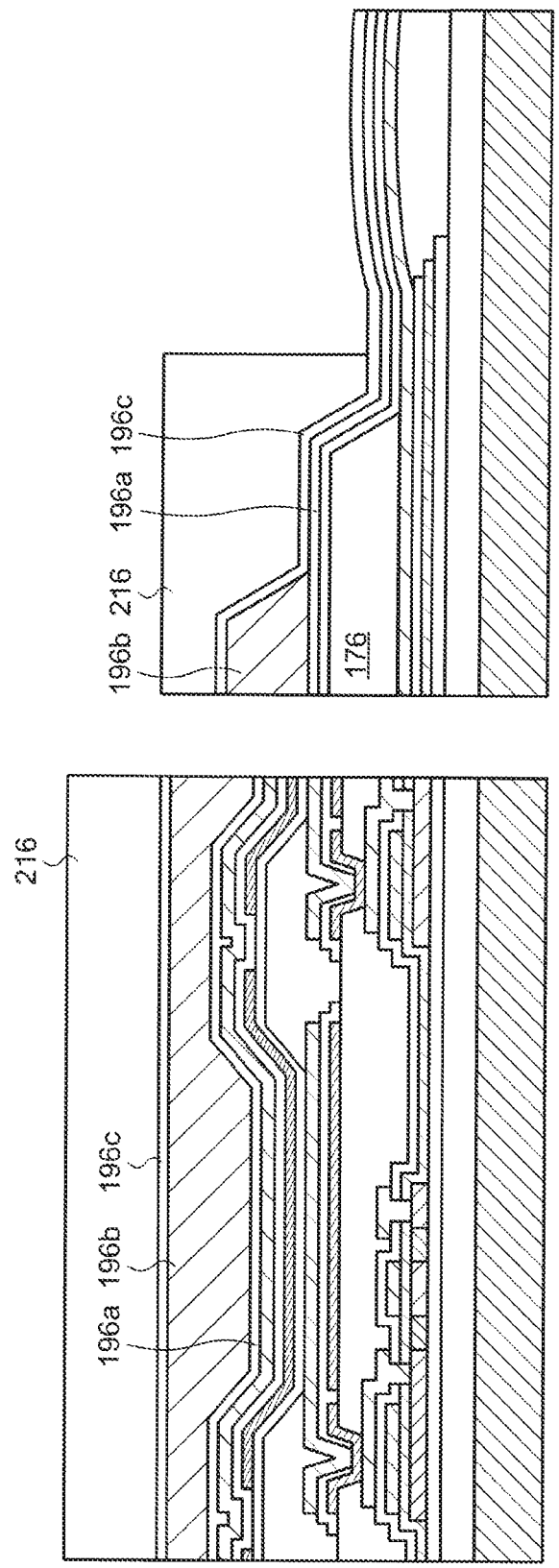

FIG. 18
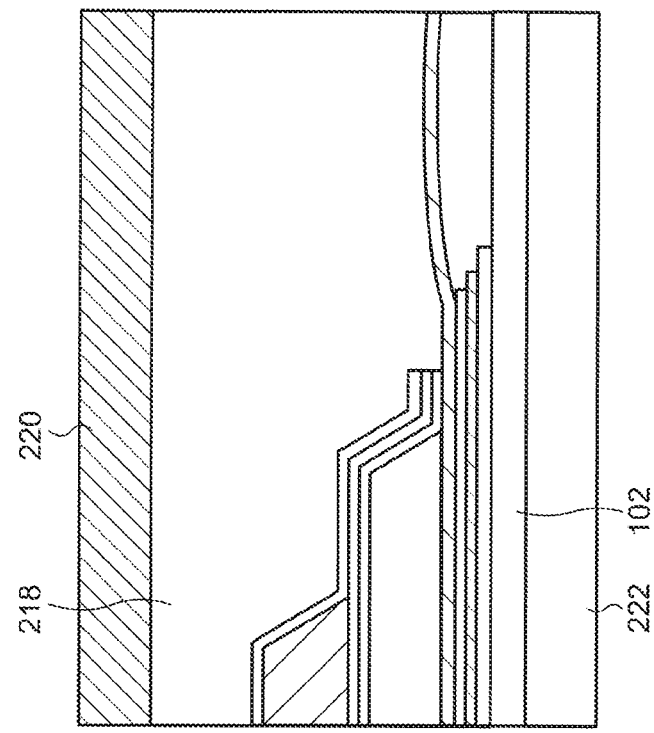
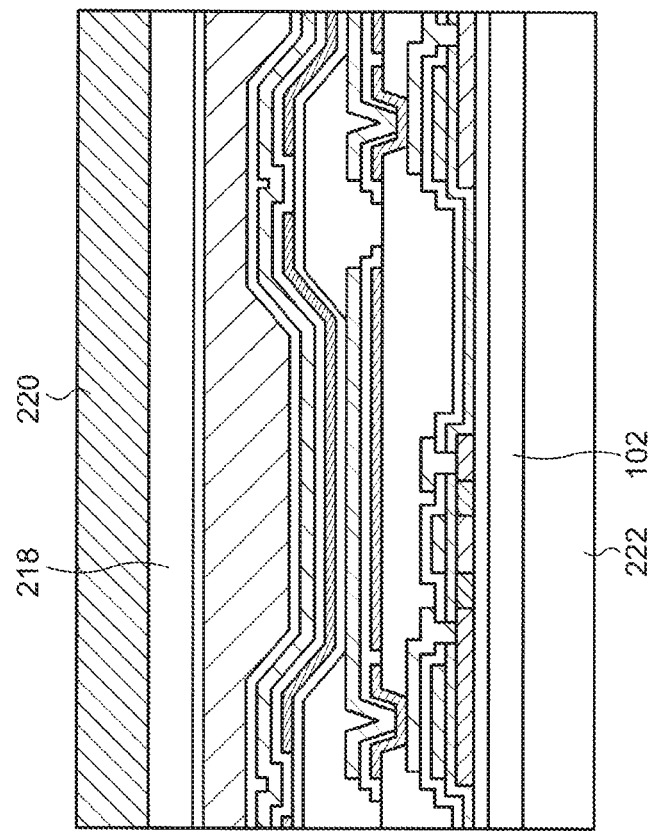

DISPLAY DEVICE AND METHOD OF MANUFACTURING DISPLAY DEVICE

CROSS REFERENCE TO RELATED APPLICATIONS

This application is based upon and claims the benefit of priority from the prior Japanese Patent Application No. 2017-254509, filed on Dec. 28, 2017, the entire contents of which are incorporated herein by reference.

FIELD

One embodiment of the present invention is related to a display device for example, a display device including an organic light emitting element as a display element, and a method of manufacturing the display device.

BACKGROUND

A liquid crystal display device and an organic EL (Electroluminescence) display device can be given as examples of a display device. In these display devices, each of a plurality of pixels formed on a substrate includes a liquid crystal element or an organic light emitting element (referred to below as a light emitting element) as a display element.

It is possible to provide flexibility to the entire display device by using a substrate having flexibility as the substrate. In this way, a display device having a curved shape or a display device which a user can freely deform are provided. In the case when display device is bent, as is disclosed in Japanese Laid Open Patent Publication No. 2016-126041, by bending the substrate so that a part which does not related to a display overlaps the display area, and it is possible to provide a display device in which the area ratio of the display area appears to be increased and having excellent design.

SUMMARY

One embodiment of the present invention is a display device. The display device includes a substrate including a first surface and a second surface on the opposite side to the first surface, a display region arranged with a plurality of pixels on the first surface, a periphery region outside of the display region of the first surface, a terminal part arranged with a plurality of terminal electrodes in the periphery region, a wiring arranged between the display region and the terminal part, a plurality of inorganic insulation layers arranged on the first surface, and an organic insulation film arranged between the display region and the terminal part. At least one of the plurality of inorganic insulation layer extends between the display region and the terminal part and includes an opening part between the display region and the terminal part. The organic insulation film is arranged overlapping the opening part, and the organic insulation film has a larger film thickness at a center part than an end part of the opening part. The wiring is arranged along an upper surface of the organic insulation film.

One embodiment of the present invention is a method of manufacturing a display device. The method includes forming an undercoat layer on a substrate including a display region and a periphery region, the undercoat layer overlapping the display region and the periphery region, forming a semiconductor film, a gate electrode and a gate insulation film sandwiched between the semiconductor film and the gate electrode above the undercoat layer of the display region, the gate insulation film extending from the display region to the periphery region, forming an interlayer insulating film overlapping the semiconductor film, the gate electrode and the gate insulation film of the periphery region, forming an opening part exposing the substrate in the periphery region by partially removing the undercoat layer, the gate insulation film and the interlayer insulating film, forming an organic insulation film contacting with the exposed substrate at the opening part, the organic insulation film having a larger film thickness at a center part than an end part of the opening part, and forming wiring along an upper surface of the organic insulation film.

BRIEF DESCRIPTION OF DRAWINGS

FIG. 10A is a schematic cross-sectional diagram showing a manufacturing method of a display device related to an embodiment of the present invention;

FIG. 10B is a schematic cross-sectional diagram showing a manufacturing method of a display device related to an embodiment of the present invention;

FIG. 10C is a schematic cross-sectional diagram showing a manufacturing method of a display device related to an embodiment of the present invention;

FIG. 11A is a schematic cross-sectional diagram showing a manufacturing method of a display device related to an embodiment of the present invention;

FIG. 11B is a schematic cross-sectional diagram showing a manufacturing method of a display device related to an embodiment of the present invention;

FIG. 11C is a schematic cross-sectional diagram showing a manufacturing method of a display device related to an embodiment of the present invention;

FIG. 12A is a schematic cross-sectional diagram showing a manufacturing method of a display device related to an embodiment of the present invention;

FIG. 12B is a schematic cross-sectional diagram showing a manufacturing method of a display device related to an embodiment of the present invention;

FIG. 12C is a schematic cross-sectional diagram showing a manufacturing method of a display device related to an embodiment of the present invention;

FIG. 14A is a schematic cross-sectional diagram showing a manufacturing method of a display device related to an embodiment of the present invention;

FIG. 14B is a schematic cross-sectional diagram showing a manufacturing method of a display device related to an embodiment of the present invention;

FIG. 15 is a schematic cross-sectional diagram showing a manufacturing method of a display device related to an embodiment of the present invention;

FIG. 18 is a schematic cross-sectional diagram showing a manufacturing method of a display device related to an embodiment of the present invention;

DESCRIPTION OF EMBODIMENTS

Figure 1:
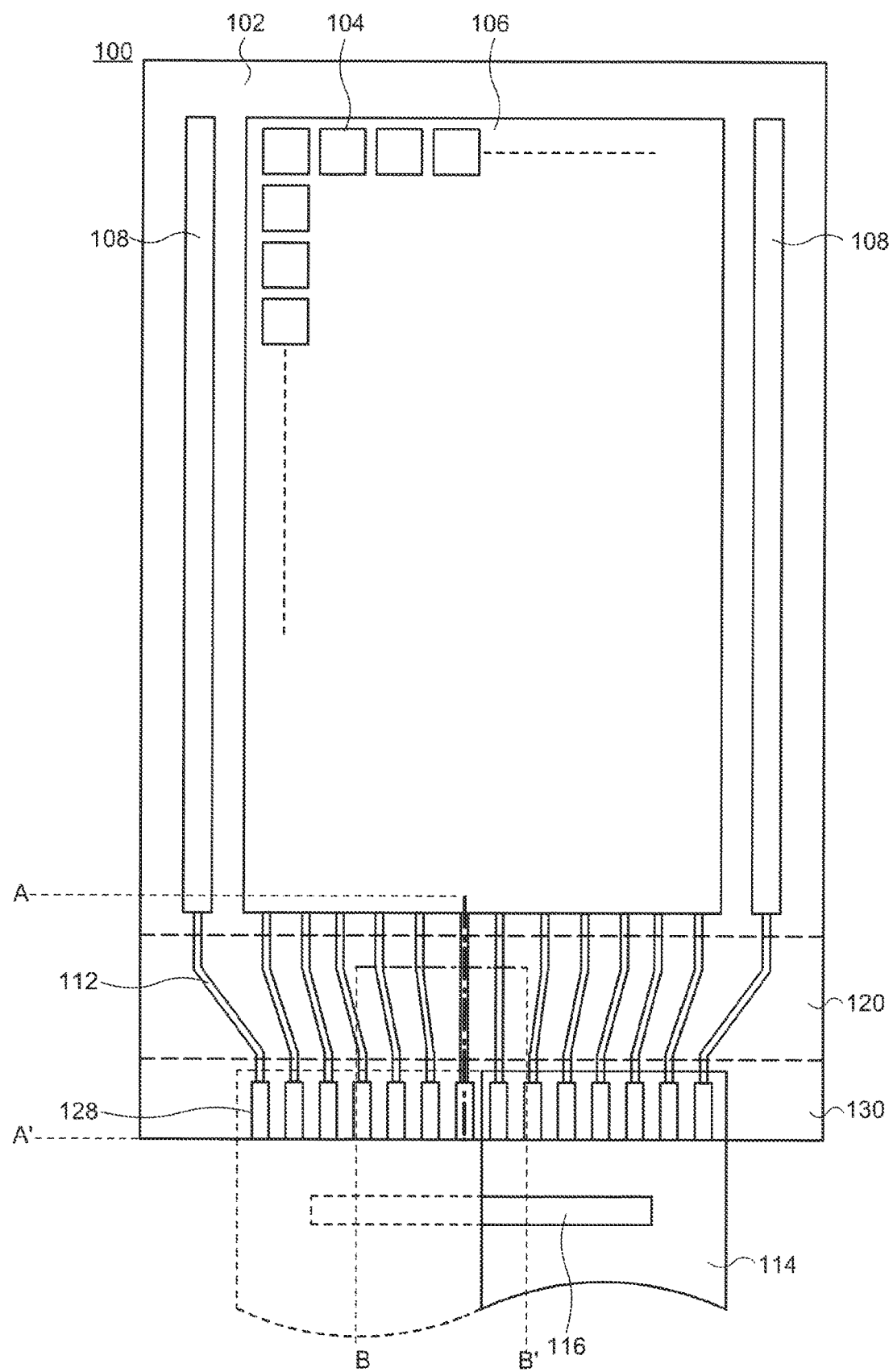
FIG. 1 is a schematic top view of a display device of an embodiment of the present invention.

Each embodiment of the present invention is explained below while referring to the drawings. However, the present invention can be implemented in various modes without departing from the gist of the invention and should not to be interpreted as being limited to the description of the embodiments exemplified below.

Although the drawings may be schematically represented in terms of width, thickness, shape, and the like of each part as compared with their actual mode in order to make explanation clearer, it is only an example and an interpretation of the present invention is not limited. In the present specification and each drawing, the same reference numerals are provided for the same elements as those described above with reference to preceding figures and an overlapping explanation may be omitted.

In the present specification and claims, when a plurality of films is formed by processing one film, the plurality of films may have functions or rules different from each other. However, the plurality of films originates from a film formed as the same layer in the same process and has the same layer structure and the same material. Therefore, the plurality of films is defined as films existing in the same layer.

In the specification and the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

In the present specification and the claims, the expression "a certain structure is exposed from another structure" means a form in which a part of a certain structure is not covered by another structure, and a part which is not covered by this other structure also includes a form in which it is covered with another structure.

First Embodiment

[1. Overall Structure]

The structure of the display device 100 which is one embodiment of the present invention is explained. FIG. 1 is a schematic top view of the display device 100. The display device 100 includes a substrate 102, and includes various patterned insulating films, semiconductor films and conductive films thereon. By appropriately combining these films, a plurality of pixels 104 and a scanning line drive circuit 108 for driving the pixels 104 is formed. Each pixel 104 is a minimum unit for providing color information and is a region including a pixel circuit for driving a display element. The plurality of pixels 104 are arranged periodically which defines a display region 106. An example in which a light emitting element is used as a display element is explained below.

The scanning line drive circuit 108 is arranged in a periphery region outside the display region 106. A wiring 112 extends from the display region 106 and the scanning line drive circuit 108 to one end of the substrate 102, and the wiring is connected to a terminal 128 formed at the end part of the substrate 102. These terminals 128 are electrically connected to a connector 114 such as a flexible printed circuit substrate (FPC). In the example shown here, a drive IC 116 having an integrated circuit formed on a semiconductor substrate is further mounted above the connector 114. An image signal and power are transmitted from an external circuit (not shown in the diagram) via the drive IC 116 and the connector 114 to the scanning line drive circuit 108 and each pixel 104 via the wiring 112. The pixel 104 is controlled and driven based on these image signals and power supply, and an image is displayed on the display region 106. The form of the drive circuit and the drive IC 116 is not limited to the form shown in FIG. 1, and for example, the drive IC 116 may be mounted on the substrate 102, and a part of the function of the drive IC 116 may be formed on the substrate 102 as a drive circuit.

Figure 2:
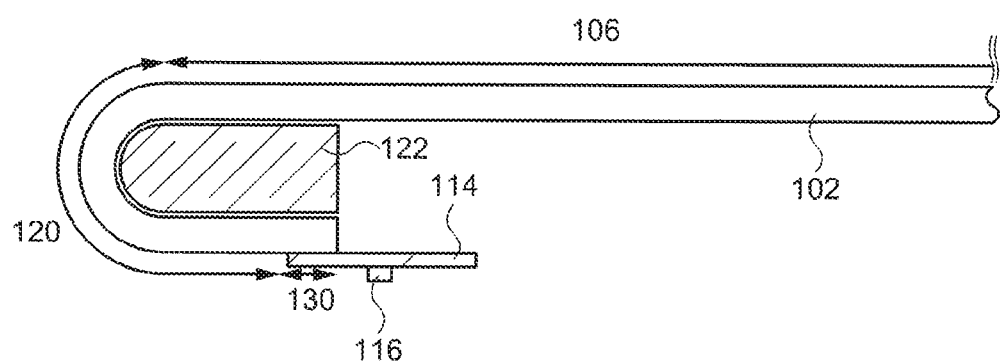
FIG. 2 is a schematic side view of a display device of an embodiment of the present invention.

By using a substrate having flexibility as the substrate 102, it is possible to provide flexibility to the display device 100, and the display device 100 can be bent or folded. For example, it is possible to be folded in a region (referred to as "wiring region" below) 120 where the wiring 112 is arranged, that is, a region between the display region 106 and a terminal part 130 where the terminal 128 is arranged. A schematic side view of a three-dimensional structure at this time is shown in FIG. 2. As is shown in FIG. 2, by bending the wiring region 120 and the wiring 112 which is arranged in this region, it is possible to arrange the terminal 128 and the connector 114 located at the end part of the substrate 102 so as to overlap with the display region 106. In the present embodiment, the display device 100 is bent along one side of the display region 106 in the direction of a surface (second surface) on the opposite side to a surface (first surface) where the plurality of pixels 104 is arranged at approximately 180°. The more the display device 100 is folded in the vicinity of the display region 106, the more it is possible to narrow the frame of the display device 100. At this time, a spacer 122 may be arranged in order to stabilize the three-dimensional structure. By folding the display device 100 in this way, it is possible to increase the ratio of the apparent area taken up by the display region 106, and it is possible to provide a display device which has excellent design.

Figure 3:
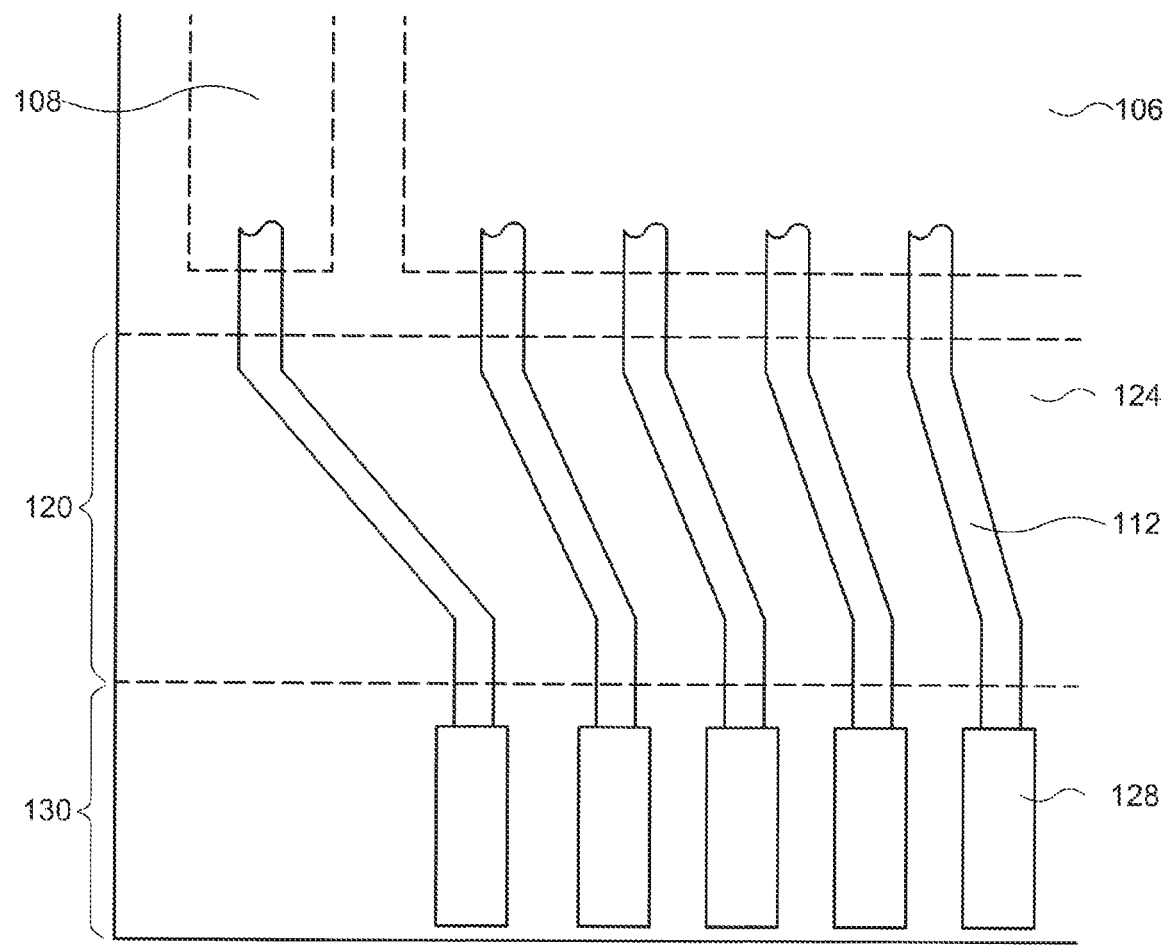
FIG. 3 is a schematic top view of a display device of an embodiment of the present invention.

An enlarged top view of the wiring region 120 is schematically shown in FIG. 3. The wiring region 120 is arranged between the display region 106 or the scanning line drive circuit 108 and the end part of the substrate 102. The terminal part 130 arranged with a plurality of terminals 128 is arranged at an end part of the substrate 102. As is shown in FIG. 3, each wiring 112 electrically connects the display region 106 or the scanning line drive circuit 108 with the terminal 128 formed at the end part of the substrate 102. The wiring 112 is arranged on the upper surface of the organic insulation film 124 in the wiring region 120.

[2. Pixel Structure]

Figure 4:
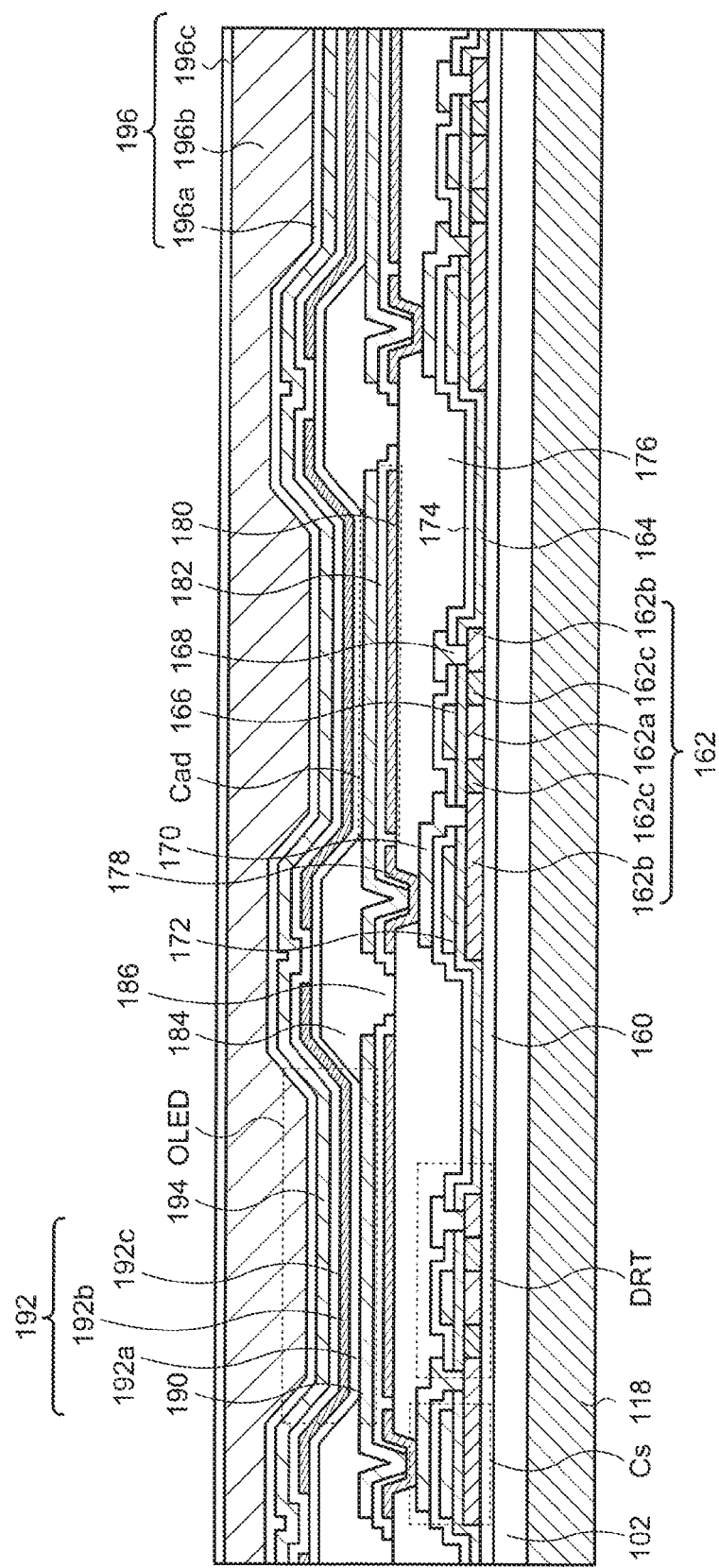
FIG. 4 is a schematic cross-sectional diagram of a display device of an embodiment of the present invention.

As described above, in each pixel 104, a pixel circuit including a light emitting element OLED is formed by various patterned insulating films, semiconductor films and conductive films. A schematic cross-sectional view of the display device 100 is shown in FIG. 4. In FIG. 4, a cross-sectional structure of a drive transistor DRT, a storage capacitor Cs, an additional capacitor Cad and a light emitting element OLED is shown among the pixel circuits of three adjacent pixels 104 formed on the substrate 102 on a support substrate 118.

Each element included in the pixel circuit is arranged on the substrate 102 via an undercoat 160. A flexible organic resin material is used as the substrate 102. Examples of the organic resin material include polymers such as polyimide, polyamide, polyester and polycarbonate, and among these, polyimide which has high heat resistance is preferred.

As is shown in FIG. 4, the undercoat 160 may have a single layer structure or may be formed from a plurality of films. In the case where a plurality of films is used, for example, a film containing silicon oxide, a film containing silicon nitride and a film containing silicon oxide may be sequentially formed on the substrate 102.

The drive transistor DRT includes a semiconductor film 162, a gate insulating film 164, a gate electrode 166 and source/drain electrodes 168 and 170. The gate insulating film 164 is sandwiched between the gate electrode 166 and the semiconductor film 162. The gate electrode 166 is arranged so as to intersect at least a part of the semiconductor film 162 interposed by the gate insulating film 164, and a channel region 162a is formed in a region where the gate electrode 166 of the semiconductor film 162 overlaps. The semiconductor film 162 further includes a low concentration impurity region 162c doped with impurities sandwiching a channel region 162a, and a source/drain region 162b doped with impurities and sandwiching these. The impurity concentration of the low concentration impurity region 162c is lower than the impurity concentration of the source/drain region 162b. Although the drive transistor DRT is a top gate type transistor in the example shown in FIG. 4, there is no restriction to the structure of the transistor included in the pixel circuit, and a bottom gate type transistor may also be used. In addition, there is also no restriction to the vertical relationship between the source/drain electrodes 168, 170 and the semiconductor film 162.

The capacitor electrode 172 which exists in the same layer as the gate electrode 166 is arranged to overlap with one source/drain region 162b via the gate insulating film 164. An interlayer insulating film 174 is arranged on the gate electrode 166 and the capacitor electrode 172. Openings which reach the semiconductor film 162 are formed in the interlayer insulating film 174 and the gate insulating film 164, and the source/drain electrodes 168 and 170 are arranged so as to cover the openings. A part of the source/drain electrode 170 overlaps a part of the source/drain region 162b and the capacitor electrode 172 via the interlayer insulating film 174, and a storage capacitor Cs is formed by a part of the source/drain region 162b, a part of the gate insulating film 164, the capacitor electrode 172, the interlayer insulating film 174 and a part of the source/drain electrode 170.

A planarization film 176 is further arranged on the drive transistor DRT and the storage capacitor Cs. The planarization film 176 has an opening which reaches the source/drain electrode 170, and is arranged so that a connection electrode 178 which covers this opening and a part of the upper surface of the planarization film 176 is in contact with the source/drain electrode 170. An additional capacitor electrode 180 is further arranged on the planarization film 176. The connection electrode 178 and the additional capacitor electrode 180 may be formed at the same time, or may be formed in different steps so as to include different materials. In the former case, the connection electrode 178 and the additional capacitor electrode 180 exist in the same layer and have the same composition.

An additional capacitor insulating film 182 is formed so as to cover the connection electrode 178 and the additional capacitor electrode 180. The additional capacitor insulating film 182 does not cover a part of the connection electrode 178 at the opening of the planarization film 176 but exposes the upper surface of the connection electrode 178. In this way, an electrical connection between the pixel electrode 190 and the source/drain electrode 170 arranged above the connection electrode 178 is possible via the connection electrode 178. The additional capacitor insulating film 182 may be arranged with an opening 186 for allowing contact between a partition wall 184 and the planarization film 176 arranged above the additional capacitor insulating film 182. Formation of the connection electrode 178 and the opening 186 is arbitrary. By arranging the connection electrode 178, it is possible to prevent corrosion of the surface of the source/drain electrode 168 in a subsequent process, and it is possible to prevent an increase in contact resistance of the source/drain electrode 168. It is possible to remove impurities within the planarization film 176 through the opening 186, thereby it is possible to improve the reliability of a pixel circuit and a light emitting element OLED.

A pixel electrode 190 is arranged to cover the connection electrode 178 and the additional capacitor electrode 180 above the additional capacitor insulating film 182. The additional capacitor insulating film 182 is sandwiched between the additional capacitor electrode 180 and the pixel electrode 190, and an additional capacitor Cad is formed by this structure. The pixel electrode 190 is shared by the additional capacitor Cad and a light emitting element OLED.

The partition wall 184 which covers an end part of the pixel electrode 190 is arranged on the pixel electrode 190. Irregularities caused by the pixel electrode 190 are alleviated by the partition wall 184, and it is possible to prevent an electroluminescent layer (referred to as "EL layer" below) 192 and an opposing electrode 194 arranged thereon from being cut. The EL layer 192 is arranged to cover the partition wall 184 and the pixel electrode 190, and the opposing electrode 194 is arranged to cover the EL layer 192. The pixel electrode 190 is formed so as to transmit visible light in the case when light emission from the light emitting element OLED is extracted through the pixel electrode 190. In this case, as a specific material, a conductive oxide which can transmit visible light such as indium-tin oxide (ITO) and indium-zinc oxide (IZO) or the like is used. On the other hand, the pixel electrode 190 is formed to reflect visible light in the case when light emission from the light emitting element OLED is extracted through the opposing electrode 194. In this case, the pixel electrode 190 includes a metal having a high reflectance of visible light such as silver or aluminum. Alternatively, the pixel electrode 190 may have a stacked structure including a film containing a conductive oxide and a film containing a metal having a high reflectance. For example, it is possible to adopt a stacked structure of a first conductive film containing a conductive oxide, a second conductive film containing a metal such as silver, aluminum or the like, and a third conductive film containing a conductive oxide.

The structure of the EL layer 192 is arbitrary, and functional layers such as a hole injection layer, hole transport layer, light emitting layer, electron transport layer, electron injection layer, electron blocking layer, hole blocking layer and an exciton blocking layer can be formed in an appropriate combination. The structure of the EL layer 192 may be the same among all the pixels 104, or a number of structures may be different between adjacent pixels 104. For example, the structure or material of the light emitting layer may be different between adjacent pixels 104, and the other layers may have the same structure. In FIG. 4, considering visibility, a hole transporting layer 192a, a light emitting layer 192b and an electron transporting layer 192c are shown as representative functional layers.

The opposing electrode 194 is formed to reflect visible light in the case when light emission from the light emitting element OLED is extracted through the pixel electrode 190. Specifically, the opposing electrode 194 is formed using a metal with high reflectance such as aluminum, silver or magnesium or the like or an alloy thereof (for example, an alloy of magnesium and silver). On the other hand, the pixel electrode 190 is formed to include a conductive oxide which can transmit visible light in the case when light emission from the light emitting element OLED is extracted through the opposing electrode 194. Alternatively, the metal or alloy described above may also be formed with a thickness which allows visible light to pass through. In this case, a film of a conductive oxide which exhibits translucency with respect to visible light may be further formed.

A passivation film 196 is arranged on the opposing electrode 194 as an arbitrary structure. The structure of the passivation film 196 can also be arbitrarily determined, and either a single layer structure or a stacked structure may be adopted. In the case of a stacked structure, for example, a structure can be adopted in which a first layer 196a containing a silicon containing inorganic compound, a second layer 196b containing a resin and a third layer 196c containing a silicon containing inorganic compound are sequentially stacked. Examples of a silicon containing inorganic compound include silicon nitride and silicon oxide. Examples of the resin include epoxy resin, acrylic resin, polyester and polycarbonate and the like.

[3. Wiring Region Structure]

Figure 5:
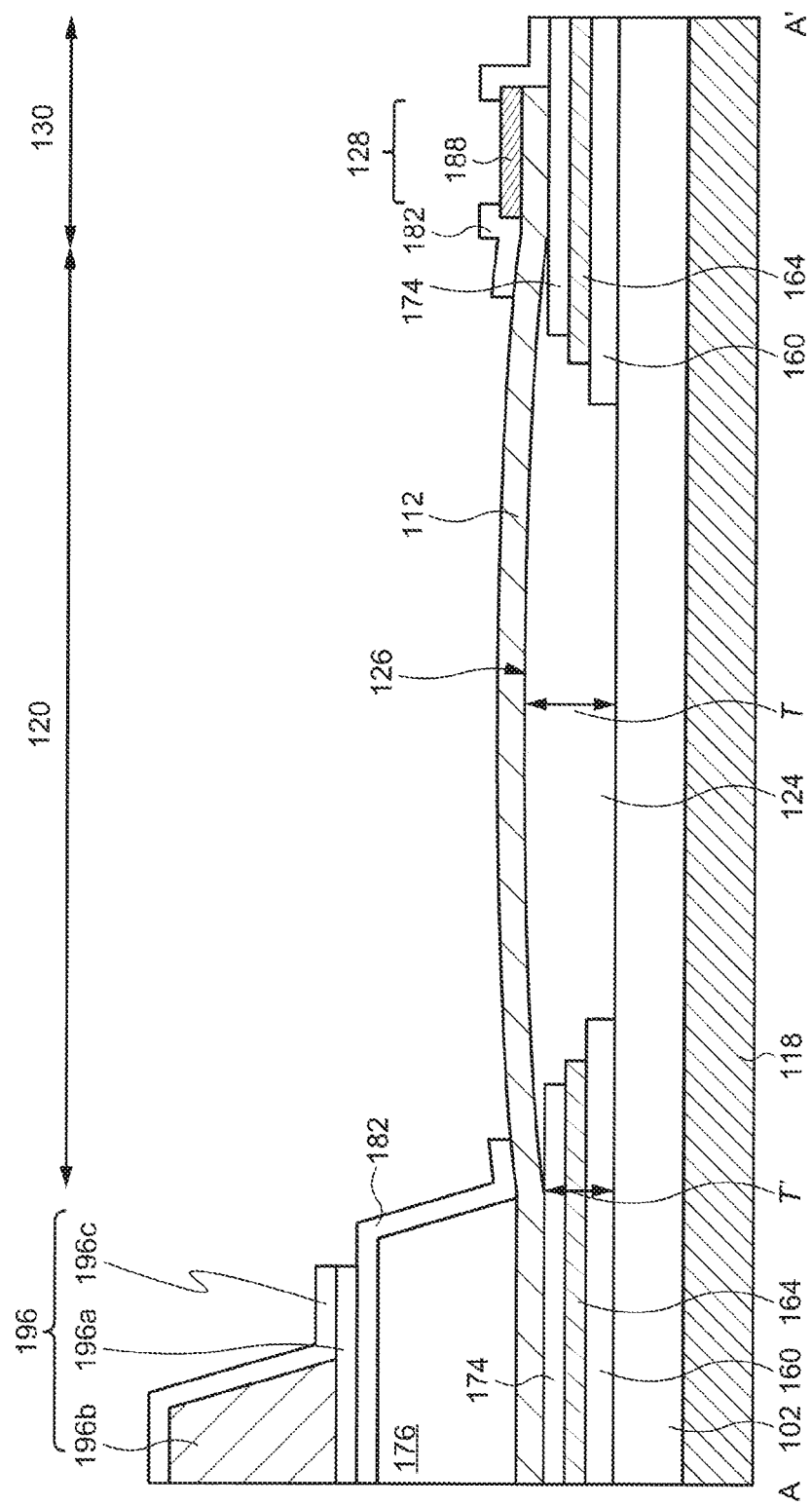
FIG. 5 is a schematic cross-sectional diagram of a display device of an embodiment of the present invention.
Figure 6:
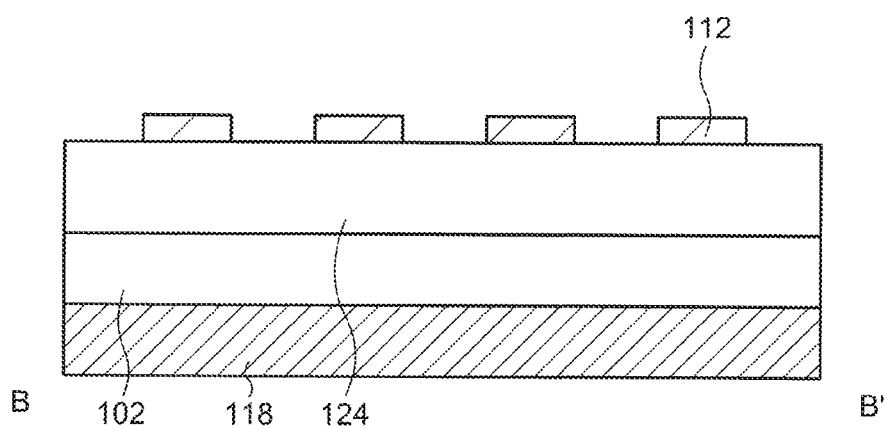
FIG. 6 is a schematic cross-sectional diagram of a display device of an embodiment of the present invention.

A schematic cross-sectional diagram along the chain line A-A' in the enlarged view in FIG. 1 is shown in FIG. 5. A schematic cross-sectional diagram along the chain line B-B' in the enlarged view in FIG. 1 is shown in FIG. 6. As described above, the undercoat 160, the gate insulating film 164 and the interlayer insulating film 174 are arranged in the display region 106. Although these are arranged on substantially the entire surface of the substrate 102 so as to also extend to the end part of the substrate 102 on the supporting substrate 118, as is shown in FIG. 5, the undercoat 160, the gate insulating film 164 and the interlayer insulating film 174 are removed in a part of the wiring region 120. That is, the undercoat 160, the gate insulating film 164 and the interlayer insulating film 174 have openings between the display region 106 and the terminal part 130. The undercoat 160, the gate insulating film 164, and the interlayer insulating film 174 each have openings which overlap each other, and the substrate 102 is exposed in these openings. The openings of the undercoat 160, the gate insulating film 164 and the interlayer insulating film 174 are formed in a band shape from one end to the other end of the substrate 102 along one side of the display region 106.

Cracks sometimes enter to the undercoat 160, the gate insulating film 164 and the interlayer insulating film 174 which are inorganic insulation films when they are bent together with the display device 100. As the undercoat 160, the gate insulating film 164 and the interlayer insulating film 174 have openings in a part of the wiring region 120, the display device 100 are easily bent at the openings of the undercoat 160, the gate insulating film 164 and the interlayer insulating film 174. As a result, it is possible to prevent breakage of the undercoat 160, the gate insulating film 164 and the interlayer insulating film 174.

In the example shown in FIG. 5, the entire opening of the undercoat 160 overlaps the opening of the gate insulating film 164, and the entire opening of the gate insulating film 164 overlaps the opening of the interlayer insulating film 174. The opening of the gate insulating film 164 is larger than the opening of the undercoat 160, and the opening of the interlayer insulating film 174 is larger than the opening of the gate insulating film 164. That is, a step structure is provided to each opening end part of the undercoat 160, the gate insulating film 164 and the interlayer insulating film 174. However, the present embodiment is not limited to this, and the opening side surfaces of the undercoat 160, the gate insulating film 164 and the interlayer insulating film 174 may exist on the same plane. The opening side surfaces of the undercoat 160, the gate insulating film 164 and the interlayer insulating film 174 may be perpendicular to the bottom surface of the film, and each opening side surface may have an acute angle with respect to the bottom surface of the film.

The organic insulation film 124 is arranged in the wiring region 120. The organic insulation film 124 is arranged to cover the openings of the undercoat 160, the gate insulating film 164 and the interlayer insulating film 174. The organic insulation film 124 covers the opening side surfaces of the undercoat 160, the gate insulating film 164 and the interlayer insulating film 174. The organic insulation film 124 covers the upper surface (surface on the opposite side to the substrate 102) at the opening end parts of the undercoat 160, the gate insulating film 164 and the interlayer insulating film 174. As is shown in FIG. 6, the organic insulation film 124 covers the substrate 102 exposed at the openings of the undercoat 160, the gate insulating film 164 and the interlayer insulating film 174. The organic insulation film 124 fills the openings of the undercoat 160, the gate insulating film 164 and the interlayer insulating film 174, and flattens the step structure which is formed by each opening. In the present embodiment, the organic insulation film 124 further includes a convex shape 126 from the end part to the center part in the vicinity of the opening of the undercoat 160, the gate insulating film 164 and the interlayer insulating film 174. The film thickness of the organic insulation film 124 at the center part is larger compared to the end parts of the openings of the undercoat 160, the gate insulating film 164 and the interlayer insulating film 174. The convex shape 126 of the organic insulation film 124 protrudes above the interlayer insulating film 174. That is, a maximum film thickness T of the organic insulation film 124 is larger than the total film thickness T' of the undercoat 160, the gate insulating film 164 and the interlayer insulating film 174. Although the shape of the convex shape 126 is not particularly limited, it is preferred to be one continuous convex shape, rounded and does not have a corner part. However, the present embodiment is not limited to this shape and it is preferred that the difference (T-T') between the maximum film thickness T of the organic insulation film 124 and the total film thickness T' of the undercoat 160, the gate insulating film 164 and the interlayer insulating film 174 is in the range of −0.5 μm or more and +2.0 μm or less. It is sufficient that the surface shape of the organic insulation film 124 have a small uneven structure.

Since the organic insulation film 124 fills the openings of the undercoat 160, the gate insulating film 164 and the interlayer insulating film 174 and is provided with the convex shape 126, the wiring 112 does not depend on the step structure formed by each opening, and it is possible to suppress a reduction in reliability due to disconnection or short circuits and the like. In addition, by suppressing breakage of the undercoat 160, the gate insulating film 164 and the interlayer insulating film 174, it is possible to further suppress a reduction in reliability due to disconnection or short circuits and or the like in the wiring 112 which is formed above.

The organic insulation film 124 contains an organic compound, and examples of the organic compound include a polymer such as a resin. The polymer is selected from polyimide, polyamide, polyester, polyolefin, polycarbonate, polysiloxane, acrylic resin and epoxy resin and the like, and may have a chain structure or may be crosslinked between molecules. Among these, polyimide having high heat resistance is preferred. The wiring 112 is arranged above the organic insulation film 124 and contacts the organic insulation film 124 in the wiring region 120. Therefore, the wiring 112 is arranged above the convex shape 126. The wiring 112 contacts the interlayer insulating film 174 in a region where the organic insulation film 124 is not arranged in the wiring region 120.

The wiring 112 is connected to a pixel circuit or the scanning line drive circuit 108 in the display region 106. In the case when the wiring 112 is connected to a pixel circuit, the wiring 112 may be formed to transmit an initialization signal or an image signal. The wiring 112 may also exist in the same layer as the source/drain electrode (for example, the source/drain electrodes 168 and 170 of the drive transistor DRT) of the transistor arranged in the pixel 104. Alternatively, in the case when the wiring 112 is a current supply line, a current supply line (not shown in FIG. 4) may be arranged between the gate electrode 166 and the source/drain electrodes 168 and 170, and the wiring 112 may be formed by wiring which exists in the same layer as the current supply line.

In the example shown in FIG. 5, the additional capacitor insulating film 182 which is arranged in the pixel 104 extends from the display region 106 to the wiring region 120, and is arranged above the wiring 112 so as to contact the wiring 112. The wiring 112 extends to near the end part of the substrate 102 and is exposed from the additional capacitor insulating film 182 in the wiring region 120. The wiring 112 is further exposed from the additional capacitor insulating film 182 at the terminal part 130 and provides a terminal 128. In the terminal 128, a protective conductive film 188 for protecting the wiring 112 is arranged above the wiring 112, and the additional capacitor insulating film 182 covers a part of the protective conductive film 188. The protective conductive film 188 exists in the same layer as the connection electrode 178 or the additional capacitor electrode 180, for example, and is preferred to include a conductive oxide such as ITO or IZO.

Figure 7:
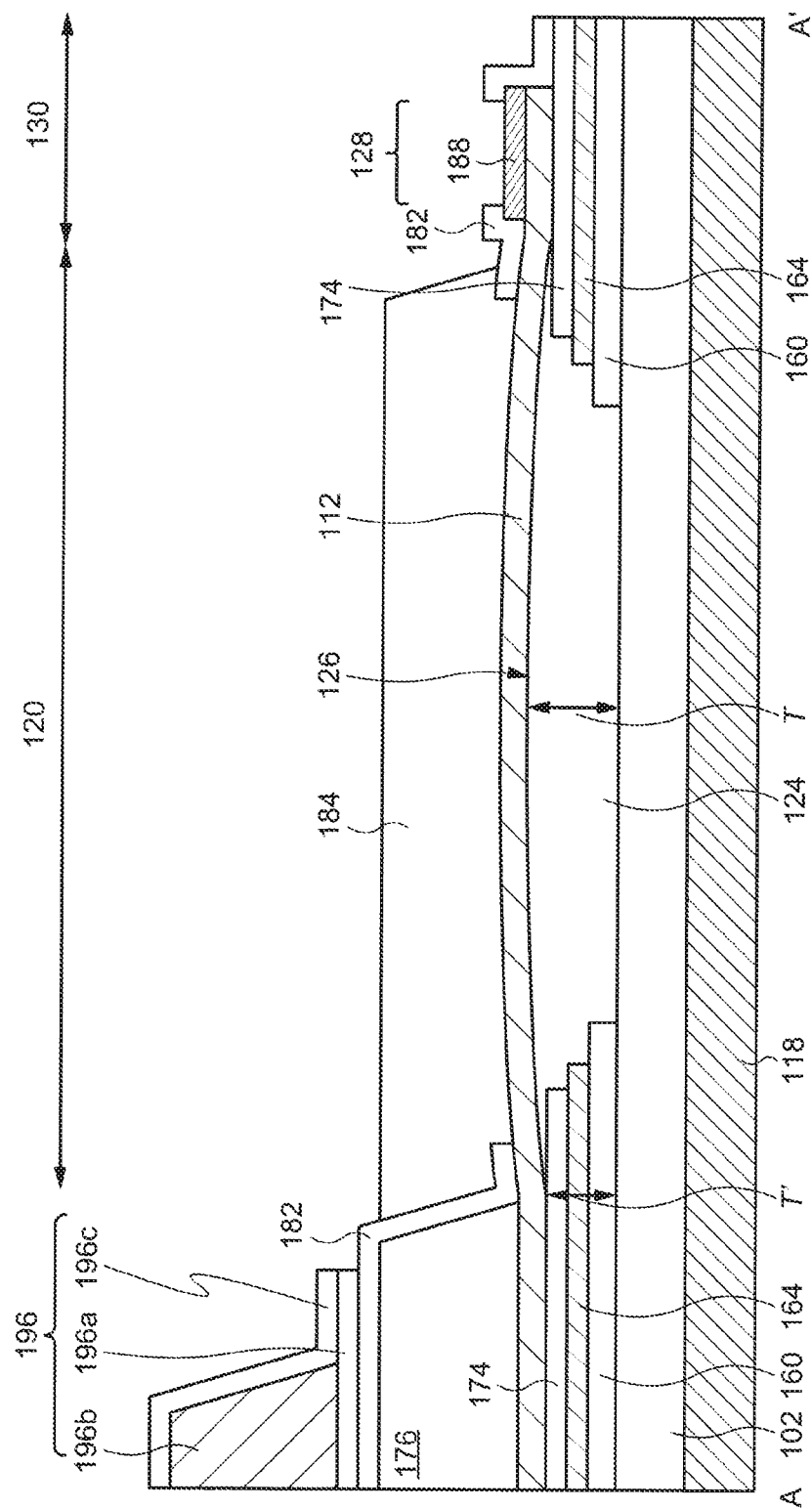
FIG. 7 is a schematic cross-sectional diagram of a display device of an embodiment of the present invention.
Figure 8:
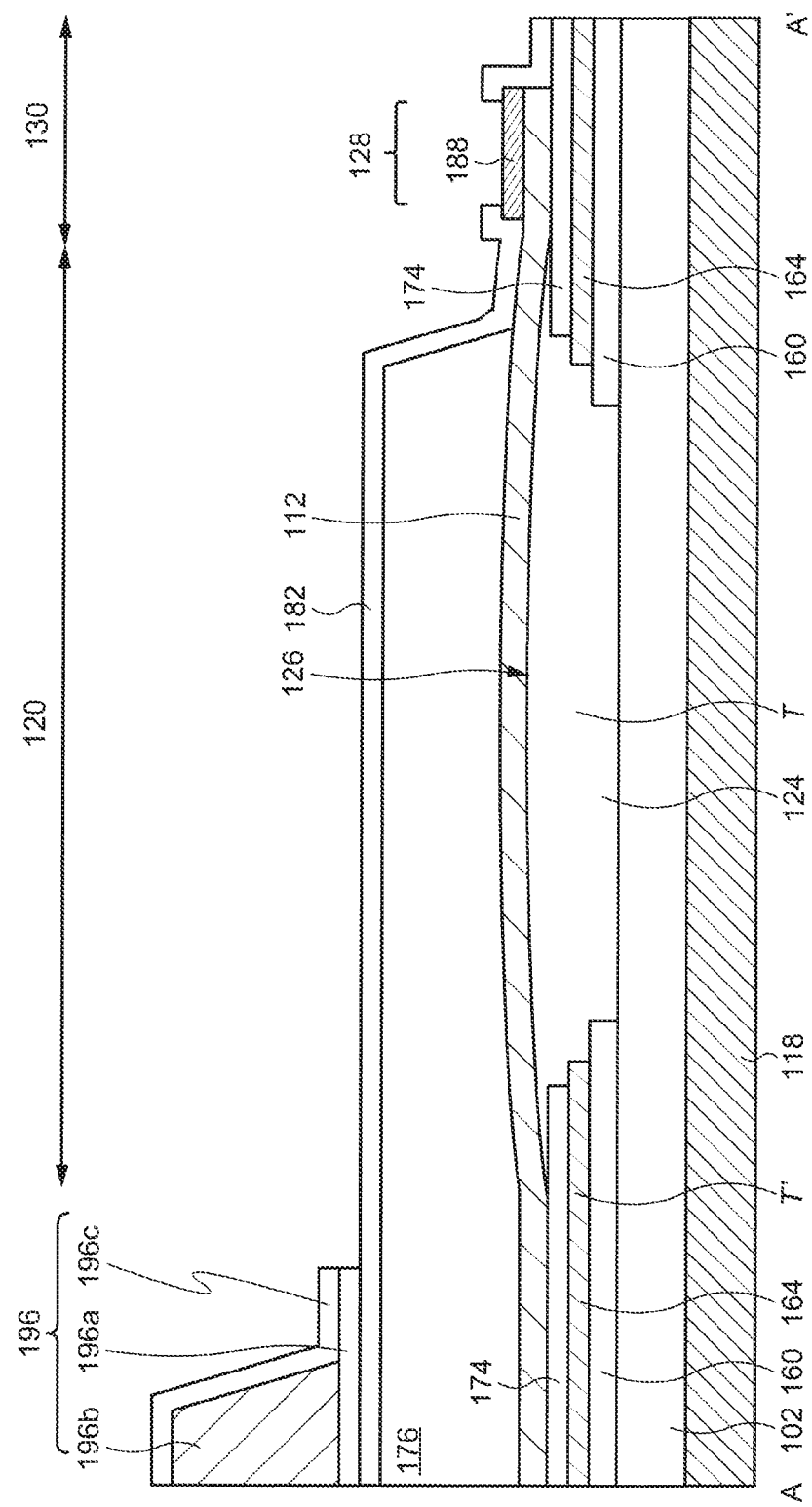
FIG. 8 is a schematic cross-sectional diagram of a display device of an embodiment of the present invention.

The wiring 112 may be protected by further arranged an insulating film above the wiring 112. For example, in the example shown in FIG. 7, the partition wall 184 which is arranged in the pixel 104 is arranged on the wiring 112 so as to contact the wiring 112. However, the present embodiment is not limited to this, and it is possible to arrange an arbitrary insulating film on the wiring region 120. In the examples shown in FIG. 5 and FIG. 7, although the planarization film 176 and the passivation film 196 do not overlap the organic insulation film 124, as shown in FIG. 8, the planarization film 176 may overlap the organic insulation film 124. In addition, although not shown in the diagram, the passivation film 196 may overlap with the organic insulation film 124.

In the display device 100 including the structure described above, by providing the undercoat 160, the gate insulating film 164 and the interlayer insulating film 174 which are inorganic insulation layers with openings in the wiring region 120, it is possible to easily bend the display device 100 and prevent breakage of the undercoat 160, the gate insulating film 164 and the interlayer insulating film 174. By providing the organic insulation film 124 with the convex shape 126 in the openings of the undercoat 160, the gate insulating film 164 and the interlayer insulating film 174, it is possible to suppress a reduction in reliability due to disconnection or short circuits and or the like of the wiring 112 formed above the convex shape 126. In addition, by suppressing breakage of the undercoat 160, the gate insulating film 164 and the interlayer insulating film 174, it is possible to further suppress a reduction in reliability due to disconnection or short circuits and the like in the wiring 112 formed above them. As a result, in the case when the display region 100 is deformed by bending the wiring region 120, it is possible to provide the display device 100 with high reliability and provide a display device with excellent design.

Second Embodiment

In the present embodiment, a manufacturing method of the display device 100 having flexibility is explained using FIG. 9A to FIG. 18. In each of these diagrams, the diagram on the left shows the pixels 104 in the display region 106 and corresponds to a part of the cross-sectional view in FIG. 4. On the other hand, the diagram on the right side is a cross sectional view of a part of the wiring region 120 which corresponds to a part of the cross-sectional view in FIG. 5. An explanation of the same or similar structure as in the first embodiment may be omitted.

Figure 9A:
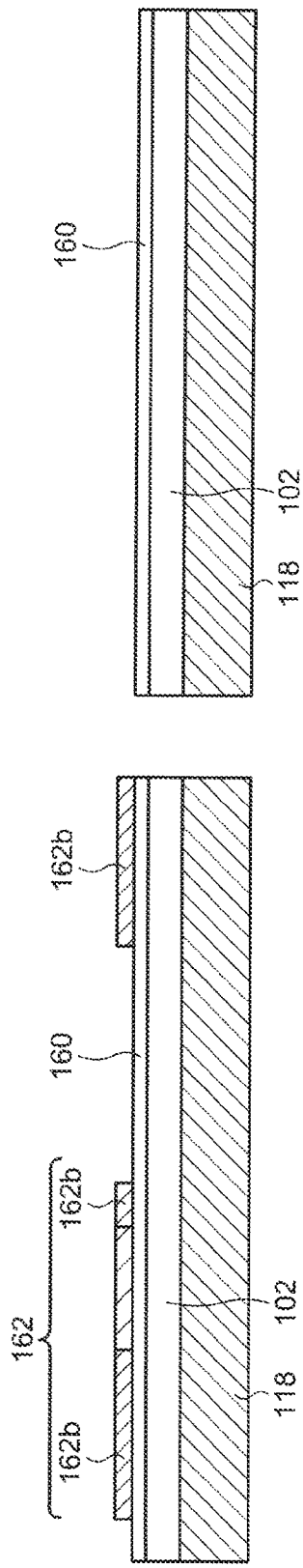
FIG. 9A is a schematic cross-sectional diagram manufacturing method of a display device related to an embodiment of the present invention.

First, the substrate 102 is formed on the support substrate 118 (FIG. 9A). The support substrate 118 includes glass or quartz and the like, and its size and thickness can be arbitrarily selected. For example, it is possible to use a glass plate having a size of 68 cm×88 cm, 110 cm×130 cm, 150 cm×185 cm, or 220 cm×250 cm as the support substrate 118. The thickness of the support substrate 118 can be arbitrarily selected in the range of 0.1 mm to 10 mm and is typically 0.5 mm to 0.7 mm.

The substrate 102 is an insulating film having flexibility and can include a material selected from polymer materials exemplified by polyimide, polyamide, polyester and polycarbonate. The substrate 102 is formed by applying a wet film formation method such as a printing method, an ink jet method, a spin coating method, a dip coating method or a lamination method and the like. In the case when the display device 100 is not provided with flexibility, the formation of the substrate 102 may be omitted.

Next, the undercoat 160 is formed on the substrate 102 (FIG. 9A). The undercoat is arranged in both the display region 106 and the wiring region 120. Although the undercoat 160 is shown formed from a single layer in FIG. 9A, as described in the first embodiment, the undercoat 160 may also have a three-layer structure. The undercoat 160 can be formed by a chemical vapor deposition (CVD) method or a sputtering method. Although not shown in the diagram, a light blocking which blocks visible light may be arranged in a region where a transistor is formed.

Next, the semiconductor film 162 is formed on the undercoat 160 (FIG. 9A). The semiconductor film 162 may be formed by a CVD method using silane gas or the like as a raw material. The obtained amorphous silicon may be heat treated or may be crystallized by irradiation with light such as laser. Next, a resist mask which is not shown in the diagram is formed in a region where the channel region 162a and the low concentration impurity region 162c of the semiconductor film 162 are formed, doping (first doping) is performed on the semiconductor film 162, and the source/drain region 162b is formed (FIG. 9A). Doping can be carried out by applying a known method.

Figure 9B:
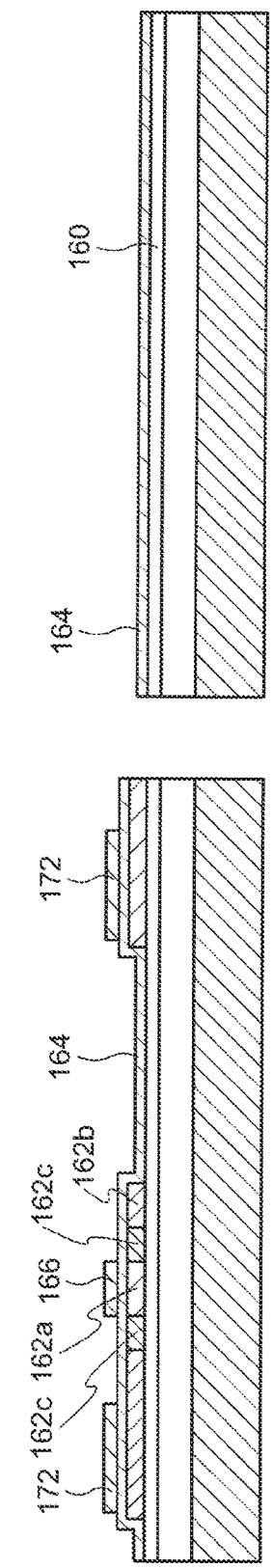
FIG. 9B is a schematic cross-sectional diagram manufacturing method of a display device related to an embodiment of the present invention.

Next, the gate insulating film 164 is formed to cover the semiconductor film 162 (FIG. 9B). The gate insulating film 164 is also arranged above the undercoat 160 of the wiring region 120. Similar to the undercoat 160, the gate insulating film 164 also includes one or a plurality of films containing silicon nitride or silicon oxide and is formed by applying a CVD method or a sputtering method.

Following this, a gate electrode 166 and a capacitor electrode 172 are formed above the gate insulating film 164 by a sputtering method or a CVD method (FIG. 9B). At this time, various scanning lines (programming control scanning line 140, initialization control scanning line 142, correction control scanning line 144, light emission control scanning line 148 and reset control line 146 and the like) are formed. Titanium, aluminum, copper, molybdenum, tungsten, tantalum and alloys thereof are examples of a metal contained in the gate electrode 166 and the capacitor electrode 172. These electrodes and wiring may have a single layer structure or may have a stacked layer structure. For example, a structure can be adopted in which a metal such as copper or aluminum having high conductivity is sandwiched between metals such as molybdenum or titanium which have a high melting point.

After this, doping (second doping) is performed on the semiconductor film 162 by a known method using the gate electrode 166 as a mask. In this way, the low concentration impurity region 162c is formed and the channel region 162a which overlaps the gate electrode 166 is formed (FIG. 9B).

Figure 9C:
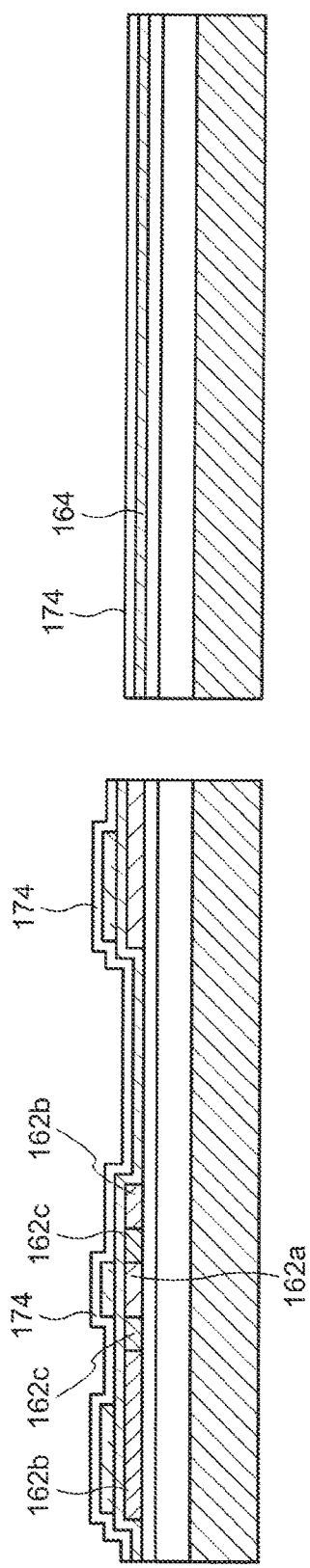
FIG. 9C is a schematic cross-sectional diagram showing a manufacturing method of a display device related to an embodiment of the present invention.

Next, the interlayer insulating film 174 is formed above the gate electrode 166 and the capacitor electrode 172 (FIG. 9C). The interlayer insulating film 174 is also formed in the wiring region 120. The interlayer insulating film 174 also includes a material which can be used for the undercoat 160 and the gate insulating film 164 and is formed including a single layer structure or a stacked layer structure by applying a CVD method or a sputtering method.

Next, the interlayer insulating film 174 is etched and an opening 210 is formed (FIG. 10A). At this time, etching is simultaneously performed also on the interlayer insulating film 174 located in the wiring region 120, and the opening 210 is formed. Next, the gate insulating film 164 is etched and an opening 212 which reaches the source/drain region 162b is formed (FIG. 10B). At this time, etching is simultaneously performed also on the gate insulating film 164 located in the wiring region 120, and the opening 212 is formed. In this way, the undercoat 160 is exposed in the wiring region 120. Next, the undercoat 160 exposed in the wiring region 120 is etched and an opening 214 exposing the substrate 102 is formed (FIG. 10O). It is possible to form the openings 210, 212 and 214 by performing plasma etching in a gas containing, for example, fluorine-containing hydrocarbon. The openings 210, 212, and 214 of the interlayer insulating film 174, the gate insulating film 164 and the undercoat 160 located in the wiring region 120 are formed in a band shape from one end to the other end of the substrate 102 along one side of the display region 106.

Next, substantially the entire surface of the substrate 102 is subjected to a liquid repellent treatment. As is shown in FIG. 11A, the surfaces of both the display region 106 and the wiring region 120 are subjected to a liquid repellent treatment. As a method of the liquid repellent treatment, for example, a liquid repellent surface is formed by applying fluorine radicals to the surface by a glow discharge plasma treatment of a fluorine-containing gas using carbon tetrafluoride or the like. The plasma treatment may be performed at normal pressure or under a reduced pressure. However, the treatment method is not limited to this, and a treatment method having high liquid repellency to a polymer resin 200 is preferred. By performing a liquid repellent treatment on the surface of the interlayer insulating film 174 in particular, the wettability of the polymer resin 200 in the interlayer insulating film 174 deteriorates and liquid repellency increases. Furthermore, the liquid repellent treatment may be performed continuously with etching of the interlayer insulating film 174, the gate insulating film 164 and the undercoat 160 described above.

Figure 19A:
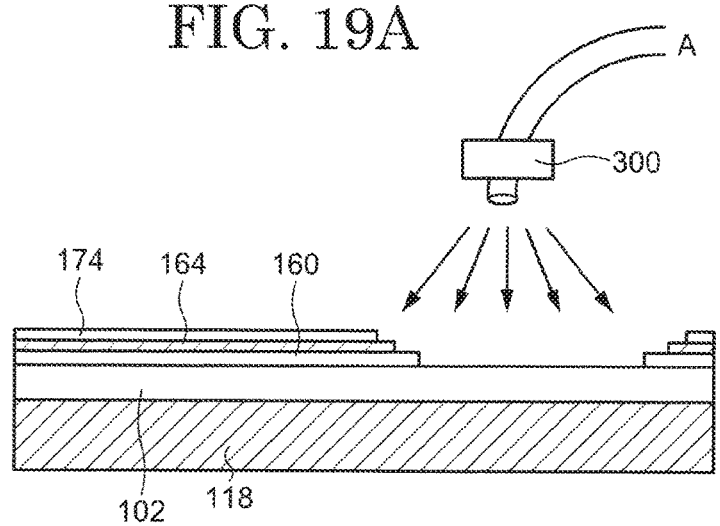
FIG. 19A is a schematic showing a manufacturing method of a display device related to an embodiment of the present invention.
Figure 19B:
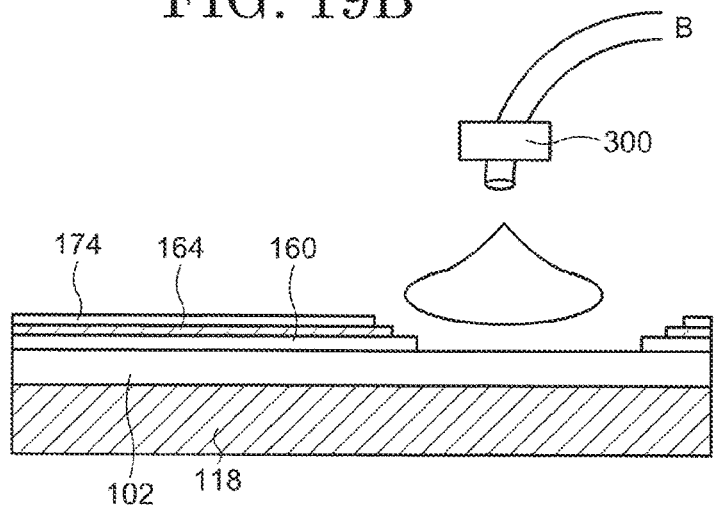
FIG. 19B is a schematic showing a manufacturing method of a display device related to an embodiment of the present invention.
Figure 19C:
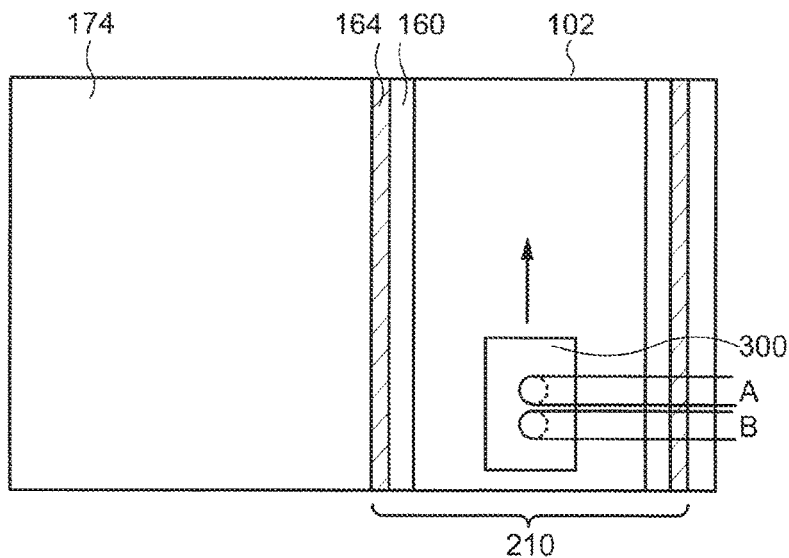
FIG. 19C is a schematic showing a manufacturing method of a display device related to an embodiment of the present invention.

Next, the vicinity of the opening 210 (including the openings 212 and 214) in the wiring region 120 is subjected to a lyophilic treatment. As is shown in FIG. 11B, the surfaces of the interlayer insulating film 174, the gate insulating film 164, the undercoat 160 and the substrate 102 in the vicinity of the opening 210 of the wiring region 120 are lyophilic treated. As a method of lyophilic treatment, for example, a lyophilic surface is formed by causing oxygen radicals to act on the surface by a glow discharge plasma treatment of a gas containing oxygen. Oxygen radicals may be irradiated using a mask having a slit in the vicinity of the opening 210 of the wiring region 120 or oxygen radicals may be irradiated in the vicinity of the opening 210 of the wiring region 120 by line scanning. In the latter case, as is shown in FIG. 19C, oxygen radicals may be irradiated immediately before application of the polymer resin 200 using a nozzle integrated with the application of the polymer resin 200 described later. At this time, a nozzle A for irradiating the oxygen radicals shown in FIG. 19A and a nozzle B for applying the polymer resin 200 shown in FIG. 19B are included in an integrated device 300 as is shown in FIG. 19C. When the device 300 proceeds in the arrow direction, it is possible to continuously apply the polymer resin 200 immediately after irradiation of the oxygen radicals. The plasma treatment may be performed at normal pressure or a reduced pressure. However, the treatment method is not limited to this, and a treatment method having high lyophilicity with respect to the polymer resin 200 is preferred. By performing a lyophilic treatment particularly on the surface of the opening 210, the wettability of the polymer resin 200 in the interlayer insulating film 174, the gate insulating film 164, the undercoat 160 and the substrate 102 is improved and lyophilicity is increased.

Next, the organic insulation film 124 is formed in the wiring region 120. Specifically, first, the polymer resin 200 described in the first embodiment is applied to the opening 210 (including the openings 212 and 214) of the wiring region 120 (FIG. 11C). The polymer resin 200 is applied to the opening 210 of the wiring region 120 using a printing method or an inkjet method and the like. At this time, the polymer resin 200 is selectively applied to the vicinity of the opening 210 of the wiring region 120 using the action of the pretreatment liquid repellent treatment (FIG. 11A) and the lyophilic treatment (FIG. 11B). By utilizing the liquid repellency and lyophilicity of the polymer resin 200 in this way, it is possible to control the film formation position of the organic insulation film 124. However, the present embodiment is not limited to this, and the pretreatment may be either the liquid repellent treatment or the lyophilic treatment.

Following this, by baking, as is shown in FIG. 12A, it is possible to obtain the organic insulation film 124 which covers the openings 210, 212, and 214 and covers a part of the undercoat 160, the gate insulating film 164 and the interlayer insulating film 174. The organic insulation film 124 protrudes above the interlayer insulating film 174 even if the polymer resin 200 shrinks during baking. That is, it is possible to form the organic insulation film 124 having the convex shape 126 which is continuous from the end part to the center part in the opening 210 (including the openings 212 and 214). In the film formation method of the organic insulation film 124 by a conventional photolithography method, the organic insulation film 124 reflects a step structure of a lower layer inorganic insulation film, and in particular, a concave structure is formed at the center part of the opening and a convex structure is formed at the opening end part. In the film formation method of the organic insulation film 124 according to the present embodiment, a single continuous convex structure is formed from the end part to the center part of the opening. In the film formation method of the organic insulation film 124 according to the present embodiment, it is possible to form the organic insulation film 124 with few concave/convex structures compared to a conventional method.

Next, a metal film is formed on the substrate 102, etching is performed and source/drain electrodes 168 and 170 which are connected to the source/drain region 162b are formed, and wiring 112 which contacts the interlayer insulating film 174 or organic insulation film 124 is formed in the wiring region 120 (FIG. 12B). A drive transistor DRT and a storage capacitance Cs are formed by the processes so far. Furthermore, it is not necessary to form the wiring 112 at the same time as the source/drain electrodes 168 and 170.

Next, the planarization film 176 is formed to cover the drive transistor DRT and the storage capacitor Cs and the like (FIG. 12C). The planarization film 176 includes a polymer material such as epoxy resin, acrylic resin, polyimide, polyester or polycarbonate and the like, and it is possible to form the planarization film 176 by applying a spin coating method, an inkjet method, a printing method or a dip coating method and the like.

Figure 13A:
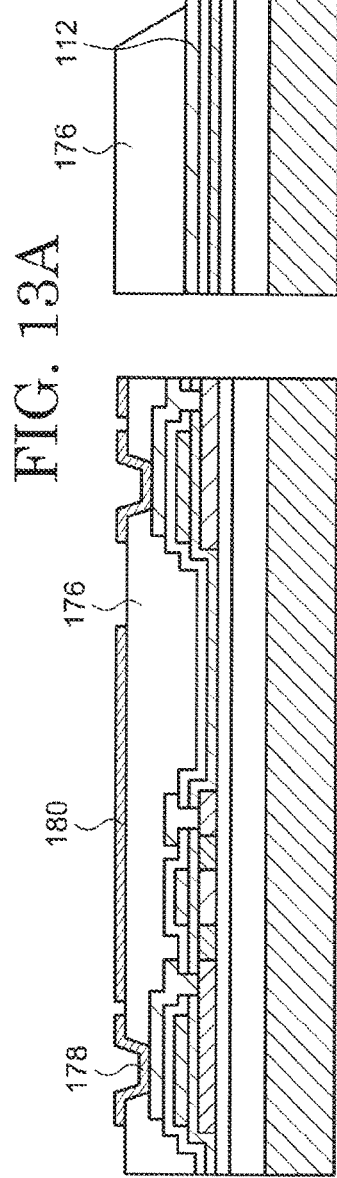
FIG. 13A is a schematic cross-sectional diagram showing a manufacturing method of a display device related to an embodiment of the present invention.

Following this, the planarization film 176 is etched, an opening which reaches the source/drain electrode 170 is formed, and unnecessary parts of the planarization film 176 in the wiring region 120 are removed as appropriate which exposes a part of the wiring 112 (FIG. 13A).

Next, the connection electrode 178 is formed to cover the opening which exposes the source/drain electrode 168, and the additional capacitor electrode 180 is formed above the planarization film 176 (FIG. 13A). At this time, a protective conductive film 188 may be simultaneously formed on the wiring 112 (see FIG. 5). The connection electrode 178, the additional capacitor electrode 180 and the protective conductive film 188 can be formed, for example, by sputtering a conductive oxide.

Figure 13B:
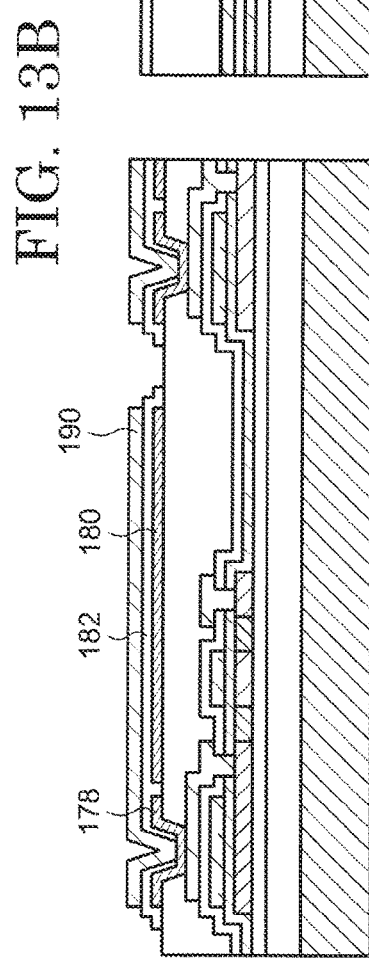
FIG. 13B is a schematic cross-sectional diagram showing a manufacturing method of a display device related to an embodiment of the present invention.

Following this, an additional capacitor insulating film 182 is formed to cover the connection electrode 178, the additional capacitor electrode 180 and the protective conductive film 188 (FIG. 13B and FIG. 5). The additional capacitor insulating film 182 can also include an inorganic compound such as silicon nitride or silicon oxide and can be formed by applying a CVD method or a sputtering method. The additional capacitor insulating film 182 has an opening which exposes a part of the upper surface of the connection electrode 178. The pixel electrode 190 of the light emitting element OLED and the connection electrode 178 are electrically connected in this opening.

Figure 13C:
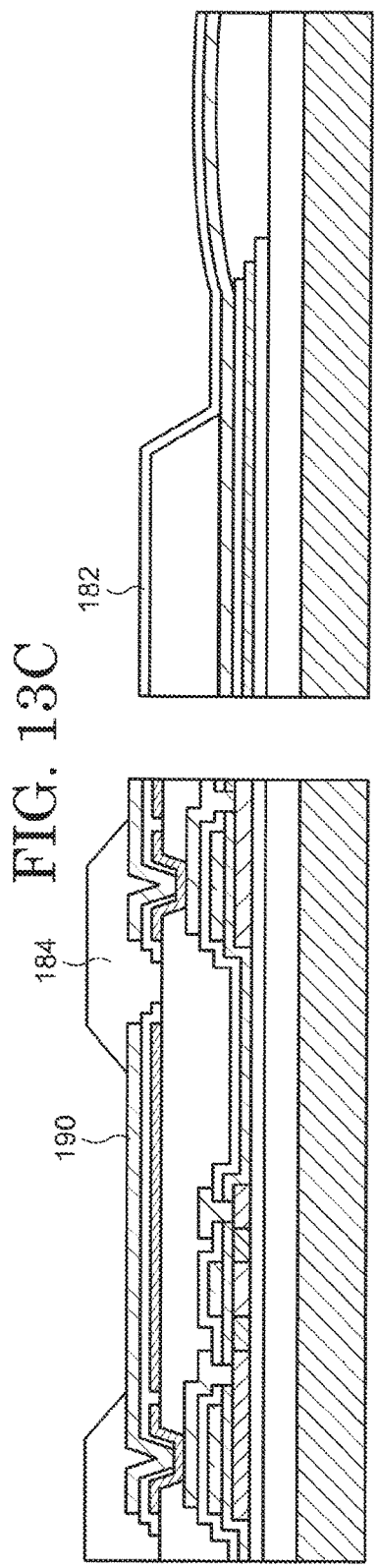
FIG. 13C is a schematic cross-sectional diagram showing a manufacturing method of a display device related to an embodiment of the present invention.

Next, the pixel electrode 190 is formed using a sputtering method or a CVD method so as to contact with the connection electrode 178 and to overlap with the additional capacitor electrode 180. (FIG. 13B). Following this, a partition wall 184 is formed to cover the end part of the pixel electrode 190 (FIG. 13C). It is possible to form the partition wall 184 using a polymer material such as an epoxy resin or an acrylic resin by using a spin coating method or an inkjet method and the like. A step caused by the pixel electrode 190 and the like can be can absorbed by the partition wall 184 and the partition wall 184 can electrically insulate pixel electrodes 190 in adjacent pixels 104.

Next, an EL layer 192 and an opposing electrode 194 of a light emitting element OLED are formed to cover the pixel electrode 190 and the partition wall 184 (FIG. 14A). The EL layer 192 is formed by applying an inkjet method or another printing method or a dry film formation method such as an evaporation method and the like. The opposing electrode 194 can also be formed by a sputtering method or an evaporation method.

Next, a passivation film 196 is formed. As is shown in FIG. 4, when the passivation film 196 has a three-layer structure, the first layer 196a is formed to cover the opposing electrode 194 (FIG. 14A). The first layer 196a includes an inorganic material such as silicon nitride or silicon oxide and is formed by applying a CVD method or a sputtering method. The first layer 196a can be provided to overlap the wiring 112. In addition, although not shown in the diagram the first layer 196a may be formed to cover the protective conductive film 188.

Next, the second layer 196b is formed. As is shown in FIG. 14B, the second layer 196b may be formed so as to absorb irregularities caused by the partition wall 184, and may have thickness which provides a flat surface. The second layer 196b can be formed by a printing method, an inkjet method or a spin coating method and the like. Alternatively, the second layer 196b may be formed by spraying an oligomer, which is the raw material of the resin described in the first embodiment, in a mist or gas state under a reduced pressure onto the first layer 196a and subsequently polymerizing the oligomer. It is preferred that the second layer 196b is formed so as not to cover the terminal 128. In the example shown in FIG. 14B, the second layer 196b is arranged so that its end part is farther from the terminal 128 than the end part of the planarization film 176. That is, the second layer 196b is formed so that the entire second layer 196b overlaps the planarization film 176.

Following this, the third layer 196c is formed to contact with the second layer 196b (FIG. 15). The third layer 196c can include materials which can be used in the first layer 196a and can be formed using a method which can be applied to the formation of the first layer 196a. The third layer 196c may also be formed to cover the protective conductive film 188.

Figure 16:
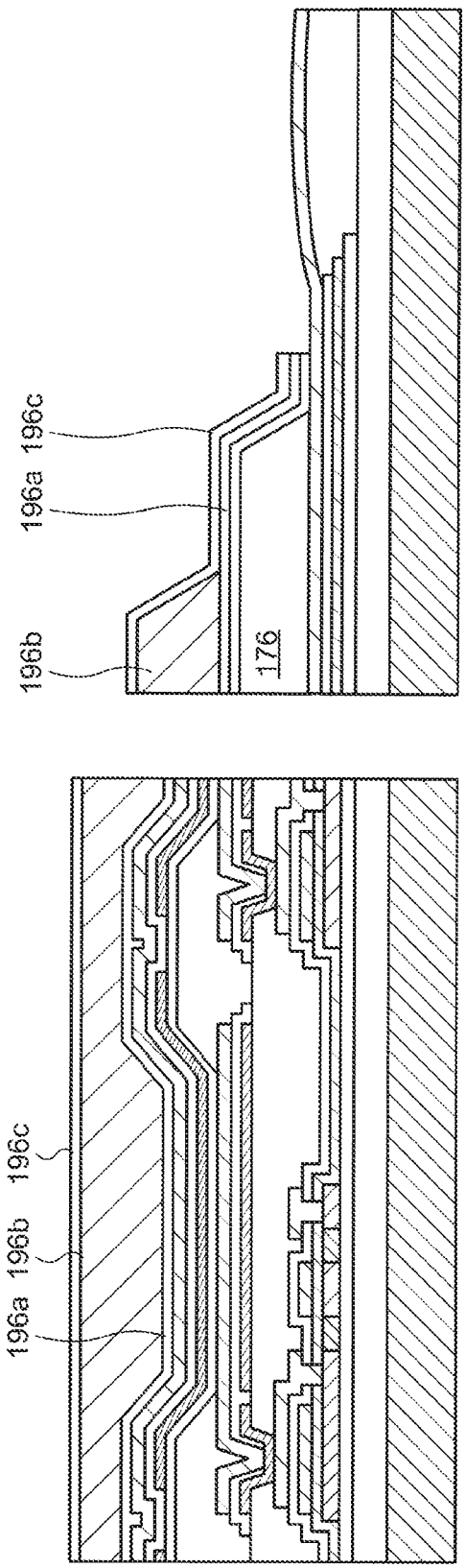
FIG. 16 is a schematic cross-sectional diagram showing a manufacturing method of a display device related to an embodiment of the present invention.

Following this, a resin mask 216 is formed to cover a part of the display region 106 and the wiring region 120 (FIG. 15). The first layer 196a, the third layer 196c and the additional capacitor insulating film 182 exposed from the resin mask 216 are removed by etching using the resin mask 216 as a mask (FIG. 16). Although not shown in the diagram, the protective conductive film 188 is exposed at the terminal 128.

Figure 17:
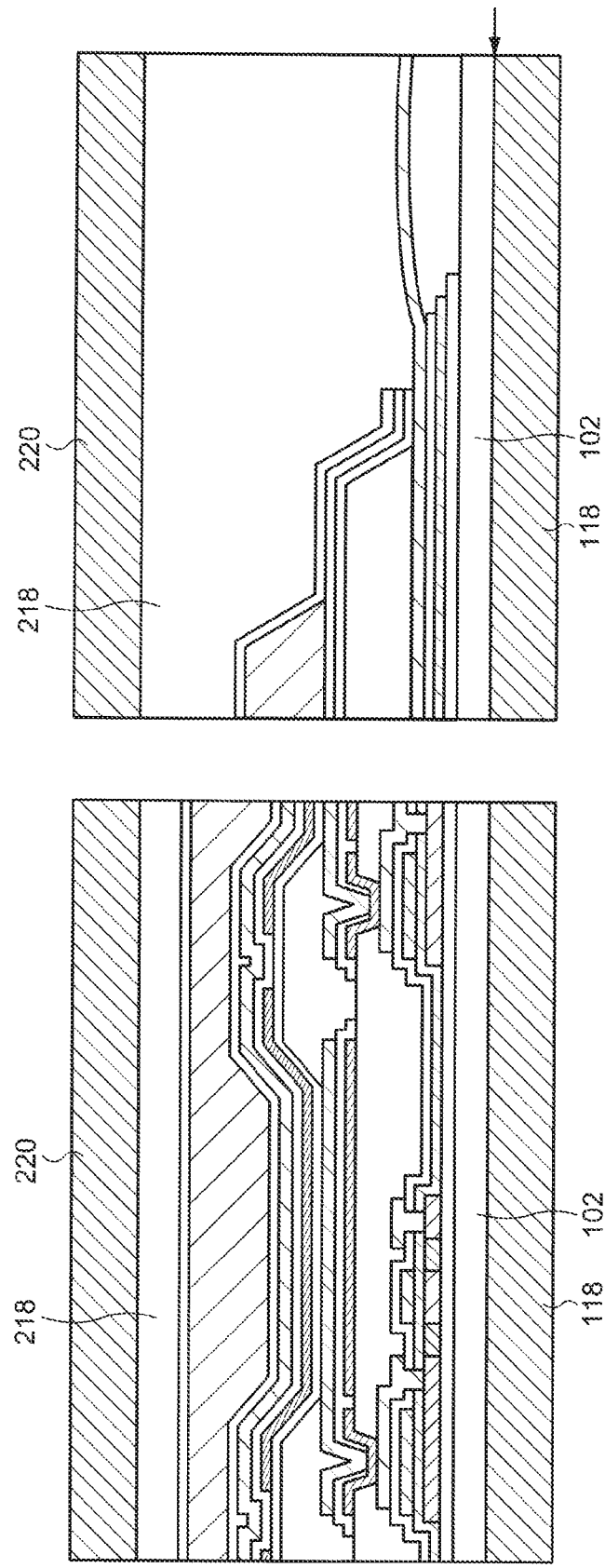
FIG. 17 is a schematic cross-sectional diagram showing a manufacturing method of a display device related to an embodiment of the present invention.

Following this, a cap film 220 may be arranged via an adhesive layer 218 to cover the display region 106 and the wiring region 120 (FIG. 17). The cap film 220 may include polymers such as polyesters such as poly(ethylene terephthalate), poly(ethylene naphthalate), polyolefins such as polyethylene and polypropylene, polycarbonate or polyacrylate and the like. The cap film 220 can be formed by a lamination method or a wet film formation method. A fluorine-containing polymer film such as polyvinylidene fluoride (PVDF) or polytetrafluoroethylene and the like, or a polymer film having low gas permeability such as polyvinylidene chloride may be arranged on the surface of the cap film 220. Although not shown in the diagram, the cap film 220 is formed so as not to cover the terminal 128. Alternatively, a part which overlaps the terminal 128 may be removed after the cap film 220 is formed so as to cover the terminal 128.

Next, light irradiation is performed using a light source such as a laser light source or a flash lamp from the support substrate 118 side and the adhesive force between the support substrate 118 and the substrate 102 is reduced. Following this, the support substrate 118 is physically peeled from the interface shown by the arrow in FIG. 17, that is, along the interface between the support substrate 118 and the substrate 102. In this way, the bottom surface of the substrate 102 is exposed.

After this, as is shown in FIG. 18, a base film 222 may be fixed to the bottom surface of the substrate 102 as an arbitrary structure. It is possible to fix the base film 222 by a lamination method. At this time, an adhesive layer may be used. The base film 222 may include materials which can be used with the cap film 220.

It is possible to manufacture the display device 100 having flexibility using the processes described above.

As can be understood from the explanation above, the display device 100 can be manufactured using a normal semiconductor manufacturing process. Therefore, by applying the present embodiment, it is possible to provide a highly reliable and flexible display device without imparting a large burden on the process.

In the manufacturing method of the display device 100 described above, the polymer resin 200 is selectively applied in the vicinity of the openings 212 and 214 of the wiring region 120 by a liquid repellent treatment (FIG. 100) and a lyophilic treatment (FIG. 11A) of the inorganic insulation layers. By utilizing the liquid repellency and lyophilicity of the polymer resin 200 in this way, it is possible to control the film formation position of the organic insulation film 124. Therefore, compared with a conventional method of forming the organic insulation film 124 by a photolithography method, it is possible to significantly suppress the amount of the polymer resin 200 as a material. In addition, in the method of manufacturing the display device 100 according to the present embodiment, a convex shape is formed from the end part to the center part of the organic insulation film 124. In the method of forming the organic insulation film 124 according to the present embodiment, the organic insulation film 124 can be formed with few concave/convex structures compared with the conventional method. Therefore, it is possible to suppress a reduction in reliability due to disconnection or short circuits and the like in the wiring 112 which is arranged above the organic insulation film 124.

The display device 100 manufactured as described above can be easily bent in the wiring region 120 in which the inorganic insulation layers, such as the undercoat 160, the gate insulating film 164 and the interlayer insulating film 174 have openings, and it is possible to prevent the undercoat 160, the gate insulating film 164 and the interlayer insulating film 174 from breaking. In addition, by suppressing breakage of the undercoat 160, the gate insulating film 164 and the interlayer insulating film 174, it is possible to further suppress a reduction in reliability due to disconnection or short circuits and or the like in the wiring 112 formed above. As a result, in the case when the display device 100 is deformed by bending the wiring region 120 in the direction of the surface (second surface) on the opposite side to the surface on which the plurality of pixels 104 are arranged (first surface), it is possible to provide a display device with high reliability and excellent designability.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

Although an EL display device is mainly exemplified in the present specification as a disclosed example, other self-light emitting type display devices, liquid crystal display devices or electronic paper type display devices such as electrophoretic elements or flat panel type display devices can be given as another application example. In addition, the display device exemplified in the present specification can be applied from a medium to small size to a large size without any particular limitation.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:
1. A display device comprising:
   a substrate including a first surface and a second surface on the opposite side to the first surface;
   a display region arranged with a plurality of pixels on the first surface;
   a periphery region outside of the display region of the first surface;
   a terminal part arranged with a plurality of terminal electrodes in the periphery region;
   a wiring arranged between the display region and the terminal part;

a plurality of inorganic insulation layers arranged on the first surface; and an organic insulation film arranged between the display region and the terminal part, wherein at least one of the plurality of inorganic insulation layers extends between the display region and the terminal part and includes an opening part between the display region and the terminal part;

the organic insulation film is arranged overlapping the opening part;

the organic insulation film has a larger film thickness at a center part than an end part of the opening part; and the wiring is arranged along an upper surface of the organic insulation film.

2. The display device according to claim 1, wherein each of the plurality of pixels includes at least a transistor, one of the plurality of inorganic insulation layers is a gate insulation film of the transistor, and the organic insulation film covers a part of the gate insulation film.

3. The display device according to claim 2, wherein one of the plurality of inorganic insulation layers is an undercoat layer arranged on the first surface of the substrate, and the organic insulation film covers a part of the undercoat layer.

4. The display device according to claim 3, wherein one of the plurality of inorganic insulation layers is an interlayer insulating film arranged above the gate insulation film and a gate electrode of the transistor in contact with the gate insulation film, and the organic insulation film covers a part of the interlayer insulating film.

5. The display device according to claim 4, wherein the plurality of inorganic insulation layers exposes the first surface of the substrate at the opening part, and the organic insulation film contacts the substrate at the opening part.

6. The display device according to claim 5, wherein the opening part extends from a first end of the substrate to a second end of the substrate opposing to the first end.

7. The display device according to claim 4, wherein the organic insulation film projects above the interlayer insulating film.

* * * * *